(12) United States Patent
Kotani

(10) Patent No.: US 8,860,061 B2
(45) Date of Patent: Oct. 14, 2014

(54) SEMICONDUCTOR LIGHT-EMITTING DEVICE, MANUFACTURING METHOD FOR THE SAME AND VEHICLE HEADLIGHT

(71) Applicant: Stanley Electric Co., Ltd., Tokyo (JP)

(72) Inventor: Hiroshi Kotani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/747,247

(22) Filed: Jan. 22, 2013

(65) Prior Publication Data

US 2013/0188381 A1   Jul. 25, 2013

(30) Foreign Application Priority Data

Jan. 23, 2012   (JP) .................................. 2012-011065

(51) Int. Cl.
| | | |
|---|---|---|
| *H01L 33/50* | (2010.01) | |
| *B60Q 1/04* | (2006.01) | |
| *H01L 33/54* | (2010.01) | |

(52) U.S. Cl.
CPC ........ *H01L 33/50* (2013.01); *B60Q 1/04* (2013.01); *H01L 33/54* (2013.01)
USPC .......... 257/98; 257/88; 257/E33.061; 438/29; 362/520

(58) Field of Classification Search
CPC ..... H01L 33/10; H01L 33/505; H01L 33/507; H01L 33/60; H01L 33/62; H01L 33/50
USPC ....................... 257/88, 98, E33.061
See application file for complete search history.

(56) References Cited

U.S. PATENT DOCUMENTS

| | | |
|---|---|---|
| 2011/0084299 A1 | 4/2011 | Kotani |
| 2012/0025218 A1 | 2/2012 | Ito |
| 2012/0235169 A1 | 9/2012 | Seko |

FOREIGN PATENT DOCUMENTS

| | | |
|---|---|---|
| JP | 2001-66547 A | 3/2001 |
| JP | 2004-314856 A | 11/2004 |
| JP | 2010-192629 A | 9/2010 |
| JP | 2010-219324 A | 9/2010 |
| JP | 2011-81985 A | 4/2011 |
| JP | 2011-145571 A | 7/2011 |
| JP | 2012-73370 A | 4/2012 |
| WO | 2004/027492 A1 | 4/2004 |

*Primary Examiner* — Tom Thomas
*Assistant Examiner* — John Bodnar
(74) *Attorney, Agent, or Firm* — Kenealy Vaidya LLP

(57) ABSTRACT

A semiconductor light-emitting device, a method for manufacturing the same and a vehicle headlight can include the light-emitting device, which is composed of a light-emitting structure including a transparent plate, at least one semiconductor light-emitting chip and a wavelength converting layer between the transparent plate and the light-emitting chip to emit various colored lights including white light. The light-emitting device can also include a mounting board mounting the light-emitting structure and a frame thereon, a reflective material disposed between the frame and the light-emitting structure and the transparent material located on the reflective material to prevent an occurrence of oil-bleeding phenomenon. Thus, the disclosed subject matter can provide the light-emitting device having a high reliability for the vehicle headlight and the like, which can be maintained at a high quality even when they have been used for a long time under harsh conditions, and methods of manufacturing such devices.

20 Claims, 9 Drawing Sheets

Fig. 2

|  |  | Exemplary Embodiment 1 | Exemplary Embodiment 2 | Conventional Embodiment | Comparative Embodiment 1 | Comparative Embodiment 2 | Comparative Embodiment 3 |
|---|---|---|---|---|---|---|---|
| First layer (Reflective material) | Filler | O | O | O | O | O | O |
|  | A-hardness | 53 | 10 | 53 | 10 | 53 | 10 |
|  | Plasticizer | Medium | Large | Medium | Large | Medium | Large |
| Second layer (Transparent material) | Filler | × | × |  | O | O | O |
|  | A-hardness | 46 | 46 |  | 53 | 75 | 75 |
|  | Plasticizer | Small | Small |  | Medium | Small | Small |
| Occurrence of leaked transparent liquid component |  | - | - | Occurrence | Occurrence (Large) | Occurrence | Occurrence (Large) |
| Occurrence of Cracks |  | - | - | - | - | Occurrence | Occurrence |

FIG. 3A Comparative Embodiment 1
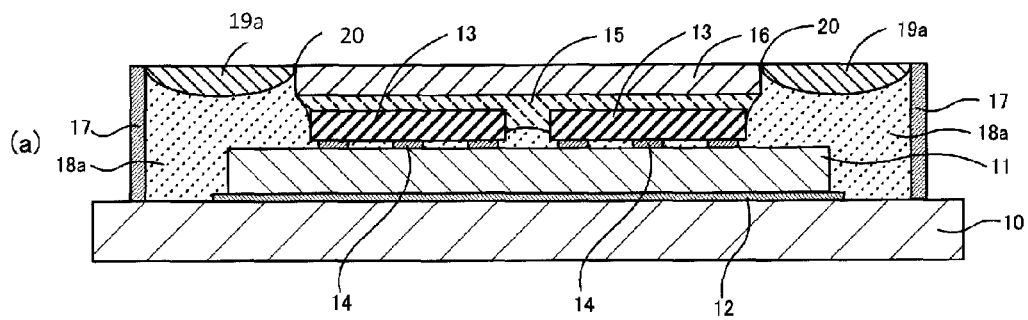
FIG. 3b Comparative Embodiment 2
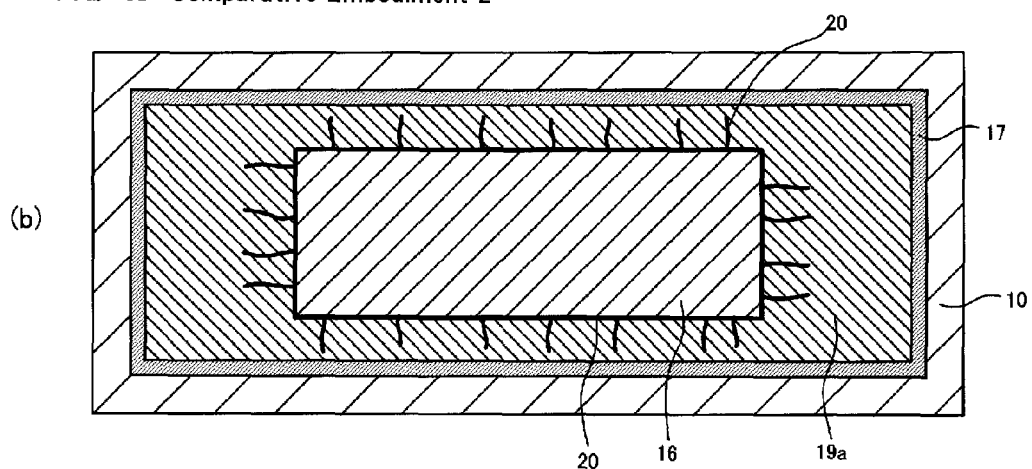

SEMICONDUCTOR LIGHT-EMITTING DEVICE, MANUFACTURING METHOD FOR THE SAME AND VEHICLE HEADLIGHT

This application claims the priority benefit under 35 U.S.C. §119 of Japanese Patent Application No. 2012-011065 filed on Jan. 23, 2012, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, to manufacturing methods for the same and to vehicle headlights. More particularly, the disclosed subject matter relates to reliable semiconductor light-emitting devices for a vehicle headlight and the like, which can be maintained at a high quality even when they have been used for a long time under a harsh condition, and to methods of manufacturing such devices, and further to vehicle headlights using the devices.

2. Description of the Related Art

Semiconductor light-emitting devices, in which a part of the light emitted from a semiconductor light-emitting chip is converted into light having a different wavelength by a phosphor and in which a mixture light including the light having the different wavelength mixed with the light emitted directly from the semiconductor light-emitting chip is emitted, have been known as a semiconductor light source for various lighting units. In these conventional cases, the semiconductor light-emitting devices are frequently provided with a wavelength converting layer composed of a resin layer including a phosphor particle on or over the semiconductor light-emitting chip such as an LED chip, etc.

Conventional semiconductor light-emitting devices including such a wavelength converting layer are disclosed in Patent Document No. 1 (Japanese Patent Application Laid Open JP2010-192629) and Patent Document No. 2 (Japanese Patent Application Laid Open JP2010-219324). FIGS. 13*a* and 13*b* are, respectively, a top view, and a side cross-sectional view taken along line A-A in FIG. 13*a*, showing a conventional semiconductor light-emitting device, which may be used as a light source for general lighting and the like and which is disclosed in Patent Document No. 2.

The conventional semiconductor light-emitting device 300 includes: a mounting board 50; a conductor pattern 51 formed on the mounting board 50; a frame 55 formed in a tubular shape and being located on the mounting board 50; a semiconductor light-emitting chip 60 mounted on the conductor pattern 51: an optical transparent material 70 including a wavelength converting layer and being located on the semiconductor light-emitting chip 60 via a light-transmitting material 80; a sealing material 40 including a light-reflecting material 45 and being disposed between the frame 55 and at least the optical transparent material 70; and a light-emitting surface 90 exposed from a top surface of the optical transparent material 70 as a light-emitting surface of the device 300 so as to be able to emit a wavelength converted light.

When carrying out a reliability test such as when conventional devices having a structure such as the above-described semiconductor light-emitting device 300 are caused to emit light continuously for a long time in a closed box, the light-reflecting material 45 dispersed in the sealing material 40 may be extremely overheated by high heat generated from the semiconductor light-emitting chip 60, and light emitted the semiconductor light-emitting chip 60 may cause a photocatalytic action which may result in a hydrophilic property.

As a result, the high heat and the light may cause an oil-bleeding phenomenon such that a liquid component exudes from the sealing material 40 toward an outside surface thereof. When an amount of the liquid component is large, the liquid components may not stay near the outside surface of the sealing material 40, and therefore may flow toward the light-emitting surface 90 of the semiconductor light-emitting device 300 and toward the frame 55.

Accordingly, the oil-bleeding phenomenon may degrade not only an outside appearance of the light-emitting device but also optical characteristics of the light-emitting device such as a light-emitting intensity, a light distribution pattern, a chromaticity distribution, etc. When the semiconductor light-emitting device is used as a light source for a headlight such that may be used for a long time under harsh conditions, a headlight using the semiconductor light-emitting device may not conform to a vehicle standard for a headlight. The light when configured as a headlight also may affect driving performance, in the worst case.

In addition, when the semiconductor light-emitting device is used as a light source for a tunnel lighting unit such that light must be emitted at any time of night or day under harsh conditions, the semiconductor light-emitting device may also be subject to the oil-bleeding phenomenon such that the light may degrade in terms of the optical characteristics of the light-emitting device. If the liquid components flow toward the light-emitting surface of the semiconductor light-emitting device, the tunnel lighting unit may also deteriorate and affect driving performance, at the worst.

The above-referenced Patent Documents are listed below, and are hereby incorporated with their English abstracts in their entireties.

1. Patent Document No. 1: Japanese Patent Application Laid Open JP2010-192629
2. Patent Document No. 2: Japanese Patent Application Laid Open JP2010-219324
3. Patent Document No. 3: U.S. patent application Ser. No. 13/229,663 published as U.S. Patent Publication No. 2012/0235169 A1.
4. Patent Document No. 4: U.S. patent application Ser. No. 12/903,200 (ST3001-0270) published as U.S. Patent Publication No. 2011/0084299 A1.
5. Patent Document No. 5: U.S. patent application Ser. No. 13/196,868 published as U.S. Patent Publication No. 2012/0025218 A1.

The presently disclosed subject matter has been devised to consider the above and other problems, features, and characteristics in the conventional art devices. Embodiments of the disclosed subject matter can include semiconductor light-emitting devices that can emit a wavelength converted light having a high reliability and a high light-emitting efficiency from a small light-emitting surface, and associated manufacturing methods that do not cause and/or are designed to prevent some of the above-described problems, concerns, and characteristics related to a light-emitting surface. The disclosed subject matter can also include a vehicle headlight using the semiconductor light-emitting device that can form a light distribution pattern including a horizontal cut-off line with a simple structure, and which can be maintained at a high quality even when it has been used for a long time under a harsh condition.

SUMMARY

The presently disclosed subject matter has been devised in view of the above and other problems, features, and characteristics in the conventional art, and to make changes to existing semiconductor light-emitting devices. Thus, an aspect of the disclosed subject matter includes methods of manufacture that provide semiconductor light-emitting devices having a high reliability and a high light-emitting efficiency, and which can provide a similar lead time while using a similar manufacture machine in comparison with conventional semiconductor light-emitting devices and processes.

According to an aspect of the disclosed subject matter, a semiconductor light-emitting device can include: a mounting board; a sub mount board having a conductor pattern located adjacent a mounting surface thereof, and located adjacent the mounting board; at least one semiconductor light-emitting chip including chip electrodes adjacent a bottom surface thereof, each of the chip electrodes electrically connected to a respective portion of the conductor pattern of the sub mounting board via solder bumps; a transparent plate formed in a substantially planar shape, and located over a top surface of the light-emitting chip so that a bottom surface thereof covers the top surface of the light-emitting chip; and a wavelength converting layer including at least one phosphor, and disposed between the bottom surface of the transparent plate and the side surface of the light-emitting chip so that the side surface thereof extends from the side surface of the light-emitting chip toward the bottom surface of the transparent plate.

Additionally, the semiconductor light-emitting device can include: a frame located adjacent the mounting board so as to surround at least the wavelength converting layer; a reflective material having a side surface including an inclined surface, and disposed at least between the frame and both a part of a side surface of the transparent plate and the side surface of the wavelength converting layer and between the bottom surface of the light-emitting chip and the mounting surface of the sub mount board, the inclined surface of the reflective material contacting with the side surface of the wavelength converting layer and extending from the side surface of the light-emitting chip toward the bottom surface of the transparent plate, an end of a top surface of the reflective material contacting with the side surface of the transparent plate, and the reflective material having a hardness configured as a resin including a filler having a reflective substance; and a transparent material having a different hardness from the hardness of the reflective material, and disposed on the top surface of the reflective material so as to cover the whole top surface of the reflective material while the end of the top surface of the transparent material contacts with the side surface of the transparent plate, and the transparent material configured as a resin including substantially no filler having a reflective substance.

In the above-described exemplary semiconductor light-emitting device, the mounting board can be integrated in the sub mount board. The side surface of the transparent plate can be composed of a first side surface adjacent the top surface thereof and a second side surface adjacent the bottom surface thereof, wherein the end of the top surface of the reflective material contacts with the second side surface of the transparent plate and the end of the top surface of the transparent material contacts with the first side surface of the transparent plate. The side surface of the transparent plate can also include at least one of a concave portion and a convex portion, wherein the side surface of the transparent material contacts with the at least one of the concave portion and the convex portion, and the top surface of the reflective material contacts with the bottom surface of the transparent material and the side surface of the transparent plate. In addition, the hardness of the reflective material can be larger than the hardness of the transparent plate.

According to the above-described exemplary semiconductor light-emitting device, the transparent material including substantially no filler having a reflective substance can cover the reflective material. Accordingly, the device can prevent the transparent material from bleeding a liquid component from the reflective material even if the oil-bleeding phenomenon occurs in the reflective material. The device can also emit a wavelength-converted light having a high light-emitting efficiency from a small light-emitting surface that is slightly larger than the top surface of the light-emitting chip, by utilizing features of the reflective material layer. Thus, the disclosed subject matter can provide semiconductor light-emitting devices that can emit a wavelength-converted light having a high reliability and a high light-emitting efficiency, which can be used as a light source for various lighting units.

In the above-described exemplary semiconductor light-emitting devices, the at least one light-emitting chip can include a blue light-emitting chip, and the at least one phosphor of the wavelength converting layer can be selected from the group consisting of a yellow phosphor, and two phosphors including a red phosphor layer and a green phosphor layer in order to emit light having various white tones matched for various lighting units such as a vehicle headlight, etc. In addition, the at least one semiconductor light-emitting chip can also include an ultraviolet light-emitting chip and the at least one phosphor of the wavelength converting layer can include at least one of a red phosphor layer, a green phosphor layer and a blue phosphor for the same purposes as described above.

Another aspect of the disclosed subject matter includes vehicle headlights using the above-described semiconductor light-emitting device that can emit light having a substantially white tone. An exemplary vehicle headlight can include: a housing; at least one parabolic reflector having an opening and a focus located on a central axis thereof, and located adjacent the housing, and the focus thereof located at the substantially semiconductor light-emitting device so that an optical axis of the light-emitting device intersects with the central axis of the parabolic reflector; and an outer lens located in front of the opening of the parabolic reflector so as to cover the opening. Therefore, the disclosed subject matter can provide reliable vehicle headlights using a semiconductor light-emitting device with a simple structure, and which can be maintained at a high quality even when they have been used for a long time under a harsh condition in the small sealed housing.

Another aspect of the disclosed subject matter includes methods for manufacturing the above-described semiconductor light-emitting devices. An exemplary method for manufacturing the device described in the above paragraphs can include: providing the mounting board, in which the sub mount board mounting the at least one semiconductor light-emitting device, the wavelength converting layer and the transparent plate is mounted on the mounting board and also the frame is mounted on the mounting board so as to surround the sub mount board; disposing an uncured reflective material having the filler between the frame and the side surfaces of the light-emitting device, the wavelength converting layer and the transparent plate; and disposing an uncured transparent material on the top surface of the reflective material layer.

In the above-described exemplary method for manufacturing semiconductor light-emitting devices, the same or similar variations of the device can also be employed as set forth in any of the above paragraphs. In addition, any of the exemplary method steps can occur sequentially, simultaneously or in different order.

According to the exemplary manufacturing method described above for the semiconductor light-emitting devices, the transparent material used for preventing an occurrence of the oil-bleeding phenomenon can be formed by disposing an uncured transparent material on the whole top surface of the reflective material so as to cover the reflective material. The reflective material and the transparent material can be solidified by a similar method as compared to conventional processes. Thus, the method can provide semiconductor light-emitting devices having a high reliability and a high light-emitting efficiency using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein:

FIG. 2 is a table showing an evaluation result after a reliability test, in which semiconductor light-emitting chips are continuously caused to emit light each at a junction temperature of 165 degrees centigrade for 1,000 hours;

FIGS. 3a and 3b are a front cross-sectional view and a top view depicting cracks generated in comparative embodiment 2 of FIG. 2, respectively;

DETAILED DESCRIPTION OF EXEMPLARY EMBODIMENTS

Figure 1:
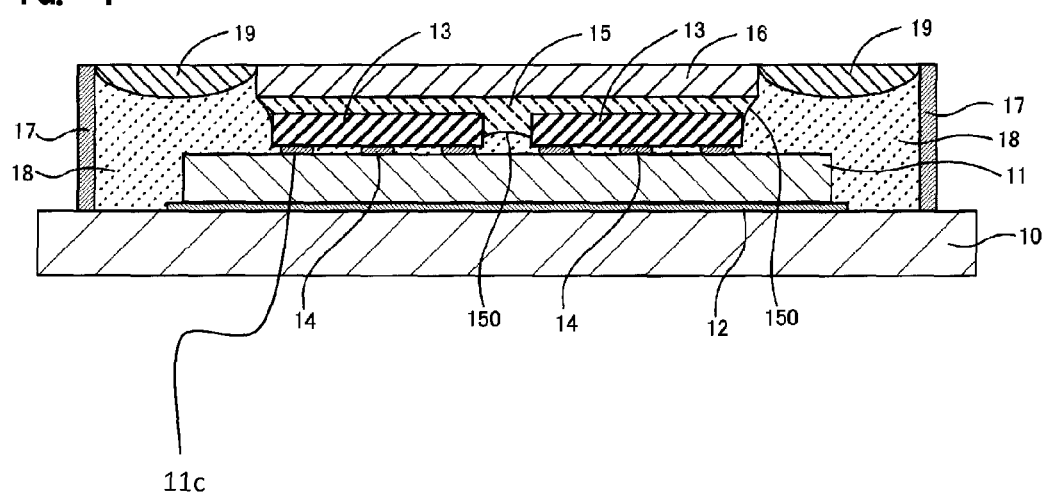
FIG. 1 is a front cross-sectional view showing a first exemplary embodiment of a semiconductor light-emitting device made in accordance with principles of the disclosed subject matter.

Exemplary embodiments and manufacturing methods of the disclosed subject matter will now be described in detail with reference to FIGS. 1 to 12. FIG. 1 is a front cross-sectional view showing a first exemplary embodiment of a semiconductor light-emitting device made in accordance with principles of the disclosed subject matter.

The semiconductor light-emitting device can include: a mounting board 10 having a mounting surface and conductor patterns formed on the mounting surface; a sub mount board 11 having a mounting (or mount) surface and conductor patterns 11*c* formed on the mounting surface, and the sub mount board 11 being located on the mounting surface of the mounting board 10 via an adhesive material 12; at least one semiconductor light-emitting chip 13 having a top surface, a bottom surface, a side surface and a bottom surface and chip electrodes adjacent the bottom surface mounted on the conductor patterns of the sub mount board 11 via solder bumps 14, and each of the chip electrodes electrically connected to respective conductor patterns of the sub mount board 11 via the solder bumps 14; a wavelength converting layer 15 having a top surface, a bottom surface and a side surface located between the top surface and the bottom surface, and the wavelength converting layer 15 being located on the top surface of the semiconductor light-emitting chip 13; and a transparent plate 16 having a top surface, a side surface, a bottom surface and an edge portion located between the top surface and the side surface, and the side surface located between the top surface and the bottom surface, and the transparent plate 16 being located on the top surface of the wavelength converting layer 15.

In addition, the semiconductor light-emitting device can include; a frame 17 having a inner surface being located along an outer circumference of the mounting board 10 so as to surround a light-emitting structure, which is composed of the sub mount board 11, the semiconductor light-emitting chip 13, the solder bumps 14, the wavelength converting layer 15 and the transparent plate 16; a reflective material 18 having a top surface, a side surface and both ends of the top surface, and disposed between the frame 17 and the light-emitting structure including the sub mount board 11 and also disposed in a space between the bottom surface of the semiconductor light-emitting chip 13 and the top surface of the sub mount board 11 so as to surround the solder bumps 14 as a first layer; and a transparent material 19 having a top surface, a bottom surface, an inner side surface and an outer side surface disposed on the top surface of the reflective material 18 so that the inner side surface thereof contacts with at least the side surface of the transparent plate 16 and the outer side surface thereof contacts at least the inner surface of the frame 17, and thereby sealing the reflective material 18 along with the frame 17 and the light-emitting structure including the transparent plate 16 as a second layer.

The bottom surface of the transparent plate 16 can be slightly larger than the top surface of the semiconductor light-emitting chip 13, and the transparent plate 16 can be located over the semiconductor light-emitting chip 13 so that the bottom surface of the transparent plate 16 can cover the top surface of the semiconductor light-emitting chip 13 via the wavelength converting layer 15. In other words, an outermost periphery of the semiconductor light-emitting chip 13 will be completely blocked from view by the transparent plate 16 when the device is viewed from a position on the main optical axis which extends normal to the top center surface of the at least one semiconductor light-emitting chip 13. Therefore, the side surface of the reflective material 18 can become a reflective surface, which can reflect light emitted in a crosswise direction from the light-emitting chip 13 toward the bottom surface of the transparent plate 16.

That is to say, the reflective material 18 can perform as a reflector for the semiconductor light-emitting chip 13 by using the side surface thereof and a boundary surface contacting with the bottom surface of the semiconductor light-emitting chip 13. Therefore, the semiconductor light-emitting device can improve light-emitting efficiency as compared with the conventional device. In addition, because the reflective material 18 contacts with the side surface of the wavelength converting layer 15, the top surface of the transparent plate 16 can perform as a light-emitting surface of the semiconductor light-emitting device. Thus, the disclosed subject matter can realize a very small light-emitting surface that is slightly larger than the top surface of the semiconductor light-emitting chip 11, by using the top surface of the transparent plate 16.

The top surface of the transparent plate 16, which can become a light-emitting surface of the semiconductor light-emitting device, can be formed in various shapes so as to be able to emit light having a desired light distribution pattern in accordance with a variety of usages, specifications and the like for the light-emitting device. The number of the semiconductor light-emitting chip 13 can also be selected according to the shape of the top surface of the transparent plate 16, the usage of the light-emitting device, etc. The top surface of the wavelength converting layer 15 can also be formed in various shapes so as to be matched with the top surface of the transparent plate 16, if desired.

In addition, the wavelength converting layer 15 can be made by mixing a phosphor with a transparent resin, an inorganic binder and the like in order to be able to emit light having a desired color tone while collaborating with the semiconductor light-emitting chip 13 as described in more detail later. The reflective material 18 can be formed by filling an uncured reflective material between the inner surface of the frame 17 and the light-emitting structure and in the space between the bottom surface of the semiconductor light-emitting chip 13 and the top surface of the sub mount board 11 so as to surround the solder bumps 14 as the first layer and by solidifying the uncured reflective material. The top surface of the reflective material 18 can be formed in a concave shape, as shown in FIG. 1, and also can be formed in a substantially planar shape.

In other words, the top surface of the reflective material 18 can be formed in a convex shape toward the mounting surface of the mounting board 10. The transparent material 19 can be disposed in the concave shape of the top surface of the reflective material 18 and configured as an oil-bleeding-shielding material as described in detail later. The top surface of the transparent material 19 can be configured to be substantially at a same level as (or co-planar with, or continuous with) the top surface of the transparent plate 16 and so that the bottom surface of the transparent material 19 become a segment extending toward the mounting surface of the mounting board 10.

The reflective material 19 can contact with the side surfaces of the transparent plate 16 and the wavelength converting layer 15, and can be located so that the inner end of the top surface of the reflective material 19 is not (or cannot be) higher than the edge portion of the transparent plate 16. On the other hand, the bottom surface of the transparent material 19 can contact with the top surface of the transparent material 18, and also can contact with the transparent plate 16 at the edge portion of the transparent plate 16 while contacting with the inner end of the top surface of the transparent material 18. In addition, the top surface of the transparent material 18 can be substantially the same level as the top surface of the transparent plate 16. That is, the inner end of the top surface of the transparent material 19 can contact with the edge portion of the transparent plate 16. The above-described concave shape of the transparent material 19 can be formed by methods, which is disclosed in Patent Document No. 3.

A part of the side surface of the reflective material 18, which contacts with the side surface of the wavelength converting layer 15, can be formed in a convex shape extending in an inward direction towards a center of the device, as shown in FIG. 1. However, the side surface should not be considered to be limited to the above shape. For example, the part of the side surface can be formed in a linear shape contacting with the side surface of the wavelength converting layer 15, and also can be formed in a concave shape extending in an outward direction away from a center of the semiconductor light-emitting device.

The side surface of the reflective material 18 toward the semiconductor light-emitting chip 15 does not always need be in contact with the wavelength converting layer 15, but may also be in contact with the side surface of the semiconductor light-emitting chip 13, which is between both ends of the top and bottom surface of the semiconductor light-emitting chip 13.

When a part of the side surface of the reflective material 18 is located on the side surface of the semiconductor light-emitting chip 13, the side surface can become the reflex (e.g., a reflector type) surface, which can return light emitted in the crosswise direction of the semiconductor light-emitting chip 13 toward the semiconductor light-emitting chip 13. When the semiconductor light-emitting chip 13 is a flip-chip type chip, because a light-emitting layer of the semiconductor light-emitting chip 13 may be located close to the bottom surface of the semiconductor light-emitting chip 13, a reflex feature of the side surface can be performed with high efficiency.

Next, each of the above-described elements will now be described in further detail. The mounting board 10 can include an Aluminum nitride substrate having a high thermal conductivity, a ceramic substrate and the like, and the conductor patterns can be made from Au (gold) and the like and formed on the mounting surface of the mounting board 10. The sub mount board 11 can also include an Aluminum nitride substrate having a high thermal conductivity, a ceramic substrate and the like, and the conductor patterns can be made from Au (gold) and the like and formed on the top surface of the sub mount board 11 to mount the semiconductor light-emitting chip 13 via the solder bumps 14 and to receive a power supply for the semiconductor light-emitting chip 13. The solder bumps 14 can be made of gold (Au), other metals, etc.

The power supply can be provided directly to the semiconductor light-emitting chip 13 mounted on the top surface of the sub mount board 11 via the conductor patterns of the sub mount board 11, and also can be provided to the semiconductor light-emitting chip 13 mounted on the top surface of the sub mount board 11 via the conductor patterns of the mounting board 10. In this case, the conductor patterns of the sub mount board 11 can connect to the conductor patterns of the mounting board 10 via through holes, which are provided on the conductor patterns of the sub mount board 11. The conductor patterns of the sub mount board 11 can also connect to the conductor patterns of the mounting board 10 via bonding wires, for example, using methods which are disclosed in Patent Document No. 4 by the present inventor as well as other known methods.

The semiconductor light-emitting chip 13 can be a blue LED chip(s) having a peak wavelength of 460 nanometers. The wavelength converting layer 15 can include a phosphor configured to convert light emitted from the semiconductor light-emitting chip 13 into a particular wavelength or range of wavelengths of light. Thus, the phosphor can be excited by the light emitted from the semiconductor light-emitting chip 13, and can emit a wavelength-converted light. Accordingly, the semiconductor light-emitting device can emit a different wavelength from that of the semiconductor light-emitting chip 13 by an additive color mixture of a part of the light emitted from the semiconductor light-emitting chip 13 and the wavelength-converted light that is produced by phosphor (or other wavelength conversion material) being excited by another part of the light.

The wavelength converting layer 15 can include a resin layer that is made by mixing a yellow phosphor such as YAG with a transparent resin such as a silicone resin and the like. In this case, the semiconductor light-emitting chip 13 can be a blue LED chip having a peak wavelength of 460 nanometers. The yellow phosphor can emit a yellow light upon being excited by blue light emitted from the blue LED chip. The semiconductor light-emitting device can emit substantially white light such that the light can be used as a light source for a headlight as described later, by an additive color mixture of the excited yellow light emitted from the yellow phosphor and a part of the blue light emitted from the blue LED chip.

The yellow phosphor can include, $Y_3Al_5O_{12}$:$Ce^{3+}$ (YAG), (Sr, Ba)$_2$SiO$_4$:$Eu^{2+}$, Ca$_x$(Si, Al)$_{12}$(O, N)$_{16}$:$Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light, and a part of the blue light.

The red phosphor can include CaAlSiN$_3$:$Eu^{2+}$, Ca$_2$Si$_5$N$_8$:$Eu^{2+}$, La$_2$O$_2$S:$Eu^{3+}$, KSiF$_6$:$Mn^{4+}$, KTiF$_6$:$Mn^{4+}$ and the like. Y$_3$(Ga, Al)$_5$O$_{12}$:$Ce^{3+}$, Ca$_3$Sc$_2$Si$_3$O$_{12}$:$Ce^{3+}$, CaSc$_2$O$_4$:$Eu^{2+}$, (Ba, Sr)$_2$SiO$_4$:$Eu^{2+}$, Ba$_3$Si$_6$O$_{12}$N$_2$:$Eu^{2+}$, (Si, Al)$_6$(O, N):$Eu^{2+}$ and the like can be used as the green phosphor. The semiconductor light-emitting chip 13 can include an LED of InGaN series that emits near-ultraviolet light having a wavelength of approximately 380 nanometers, a laser diode that emits ultraviolet light at a high power, and the like.

In this case, in order to emit substantially white light such that the light can be used as a light source for a headlight, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. CaAlSiN$_3$:$Eu^{2+}$, Ca$_2$Si$_5$N$_8$:$Eu^{2+}$, La$_2$O$_2$S:$Eu^{3+}$, KSiF$_6$:$Mn^{4+}$, KTiF$_6$:$Mn^{4+}$ and the like can be used as the red phosphor. (Si, Al)$_6$(O, N):$Eu^{2+}$, BaMgAl$_{10}$O$_{17}$: $Eu^{2+}Mn^{2+}$, (Ba, Sr)$_2$SiO$_4$:$Eu^{2+}$ and the like can be used as the green phosphor. (Sr, Ca, Ba, Mg)$_{10}$(PO$_4$)$_6$C$_{12}$:$Eu^{2+}$, BaMgAl$_{10}$O$_{17}$:$Eu^{2+}$, LaAl(Si, Al)$_6$(N, O)$_{10}$:$Ce^{3+}$ and the like can be used as the blue phosphor.

In addition, the wavelength converting layer 15 can be made by mixing a phosphor with a transparent resin, an inorganic binder and the like in order to be able to emit light having a desired color tone while collaborating with the semiconductor light-emitting chip 13. Specifically, the semiconductor light-emitting device can emit light having various color tones by varying a combination of the above-described phosphors, and/or by varying a density ratio of the combination of the phosphors in accordance with a variety of usages.

On the side surface of the wavelength converting layer 15, an inclined surface 150 may be formed between the bottom surface of the transparent plate 16 and the side surface of the semiconductor light-emitting chip 13. The inclined surface 150 may also occur between the adjacent side surfaces of the adjacent light-emitting chips 13, when the at least one semiconductor light-emitting chip 13 is a plurality of chips. The inclined surface 150 may include a concave shape toward the wavelength converting layer 15 as shown in FIG. 1.

The transparent plate 16 can be a transparent material, which can transmit light emitted from the semiconductor light-emitting chip 13 via the wavelength converting layer 15. A transparent resin such as a silicone resin, an epoxy resin and the like can be used, and a transparent resin that is made by mixing a filler having a particle size of 0.001 to 50 micro meters with the above-described transparent resin and an inorganic material such as a glass and the like can be used as the transparent plate 16. A ceramic plate (e.g., YAG plate) that is made by sintering a phosphor material can also be used as the transparent plate 16.

The top surface and the bottom surface of the transparent plate 16 are formed in a substantially planar shape as shown in FIG. 1. However, both shapes of the top and the bottom surfaces of the transparent plate 16 should not be limited to the planar shape. At least one of the top and the bottom surfaces of the transparent plate 16 can be formed in a fine concave-convex shape to diffuse the above-described wavelength converted light and to form a prescribed light distribution using the wavelength converted light. A surface treatment can be formed on the top surface of the transparent plate 16 in order to improve light-emitting efficiency as a light-emitting surface of the device, and the top surface of the transparent plate 16 can also be formed in a lens shape to form the prescribed light distribution.

The frame 17 can be formed from the same material as the mounting board 10, such as with aluminum nitride having a high thermal conductivity, ceramics, and the like. The frame 17 can be attached on the outer circumference of the mounting surface of the mounting board 10 via an adhesive material so as to surround the transparent plate 16, the wavelength converting layer 15, the semiconductor light-emitting chip 13, the sub mount board 11 and the solder bumps 14, via the reflective material 18 and the transparent material 19, which contact with the inner surface of the frame 17.

The reflective material 18 can include a base material such as a resin including a silicon resin and an inorganic binder, and also can include a filler such as titanium oxide, zinc oxide, tantalum oxide, niobium oxide, zirconia oxide, aluminum oxide, aluminum nitride and the like as a reflective substance in the base material. A hardness of the reflective material 18 can be approximately between 10 and 60 under JIS-A standard.

As the reflective material 18 becomes soft, because an amount of the plasticizer such as a silicon oil and the like becomes larger in the reflective material 18, the plasticizer may move toward an outside surface of the reflective material 18 as a transparent liquid component of an oil-bleeding phenomenon. Accordingly, the hardness of the reflective material 18 can be 30 to 60 (e.g., 53) under JIS-A standard so that an amount of emergence of the transparent liquid component does not become large.

The reflective material 18 can be disposed between the frame 17 and the light-emitting structure including the sub mount board 11, and also can be disposed in the space between the bottom surface of the semiconductor light-emitting chip 13 and the top surface of the sub mount board 11 so as to surround the solder bumps 14 as the first layer. In this case, on the top surface of the reflective material 18, which is located between the inner surface of the frame 17 and the side surface of the transparent plate 16, a concave shape may be formed as shown in FIG. 1. However, the top surface of the reflective material 18 may be formed in the substantially planer shape as described above.

The transparent material 19 can be disposed on the top surface of the reflective material 18 of the first layer as the second layer so as to fill the concave shape of the top surface of the reflective material 18. When the transparent material 19 is viewed from the top surface of the transparent plate 16, which is the light-emitting surface of the device, the transparent material 19 may become a ring shape. The transparent material 19 can contact with the side surface of the transparent plate 16 by using the inner side surface of the ring shape, and also can contact with the inner surface of the frame 17 by using the outer side surface of the ring shape. Therefore, the transparent material 19 can combine with the frame 17 and the light-emitting structure including the transparent plate 16 to seal the reflective material 18 within the device.

The transparent material 19 can include a base material such as a resin including a silicon resin and an inorganic binder in common with the reflective material 18. However, the transparent material 19 may not include the filler having the substantially reflective substance, although the transparent material may include a small quantity of the plasticizer such that the oil-bleeding phenomenon is prevented. A hardness of the transparent material 19 can be 30 to 60 (e.g., 46) under JIS-A standard. The transparent material 19 is not limited to an absolute transparent material, but the transparent material 19 may be composed of a semi-transparent material, a colored transparent material, etc.

A boundary between the transparent material 19 and the reflective material 18 can be defined as a border between the reflective material 18 including the reflective substance, which is disposed as the first layer toward the transparent material 19 from the mounting surface of the mounting board 10, and the transparent material 19 which does not include the substantially reflective substance, and which is disposed as the second layer toward the reflective material 18 from the top surface of the transparent material 19. An inner end of the boundary can contact with the side surface of the transparent plate 16, and an outer end of the boundary can contact with the inner surface of the frame 17.

When the base materials of the reflective material 18 and the transparent material 19 are the same material having a substantially same hardness, because the reflective material 18 can include the filler as the reflective substance and the transparent material 19 does not include the filler having the substantially reflective substance, the hardness of the transparent material 19 is smaller than that of the reflective material 18. Therefore, the boundary between the transparent material 19 and the reflective material 18 may also be defined as a border between different hardnesses, in which the hardness of the transparent material 19 is smaller than that of the reflective material 18 when the same base material having the substantially same hardness is used for the reflective material 18 and the transparent material 19.

The transparent material 19 can be formed on the top surface of the reflective material 18 between the side surface of the transparent plate 16 and the inner surface of the frame 17, and the top surface of the transparent material 19 can contact slightly with the side surface of the transparent plate 16 so that the reflective material 18 is located between the bottom surface of the transparent material 19 and the side surface of the transparent plate 16. Therefore, the semiconductor light-emitting device can be constructed so that the top surface of the transparent plate 16 can become the light-emitting surface, which is slightly larger than the top surface of the semiconductor light-emitting chip 13.

According to the semiconductor light-emitting device having the above-described structure, light emitted in an upward direction from the semiconductor light-emitting chip 13 can enter into the wavelength converting layer 15, and a wavelength converted light can be emitted from the top surface of the transparent plate 16, which is the light-emitting surface of the device. At least some of the light emitted in a downward direction from the semiconductor light-emitting chip 13 can be reflected by at least one of the bottom surface of the semiconductor light-emitting chip 13, the reflective material 18 and the top surface of the sub mount board 11, and then a wavelength converted light can be emitted from the top surface of the transparent plate 16 via the top surface of the wavelength converting layer 15 as well as the light emitted in the upward direction from the semiconductor light-emitting chip 13.

Light emitted in a crosswise direction from the semiconductor light-emitting chip 13 such as light emitted from the side surface of the semiconductor light-emitting chip 13 and light directed in a crosswise direction from the wavelength converting layer 15 can be reflected toward the top surface of the transparent plate 16 via the reflective material 18 while being wavelength-converted by the wavelength converting layer 15, and the wavelength converted light can be emitted from the top surface of the transparent plate 16 to the outside of the device.

FIG. 2 is a table showing an evaluation result after a reliability test, in which the semiconductor light-emitting chips are continuously lit each at a junction temperature of 165 degrees centigrade for 1,000 hours, using exemplary embodiments 1 and 2, a conventional embodiment without a transparent material of the second layer and comparative embodiments 1 to 3 each having different first layers and second layers to compare to the exemplary embodiments 1 and 2.

In the exemplary embodiment 1, a reflective material having A-hardness of 53 (under JIS-A standard) is used as the reflective material 18, and a transparent material having A-hardness of 46 is used as the transparent material 19 without the filler having the reflective substance. In the exemplary embodiment 2, a reflective material having A-hardness of 10, which includes a large amount of the plasticizer, is used as the reflective material 18, and the transparent material having A-hardness of 46 is used as the transparent material 19 without the filler having the reflective substance, which is the same as the transparent material having A-hardness of 46 in the exemplary embodiment 1.

In evaluation results of the exemplary embodiments 1 and 2 after the reliability test, in which the semiconductor light-emitting chips 13 were continuously lit each at a junction temperature of 165 degrees centigrade for 1,000 hours, neither the exemplary embodiment 1 nor 2 caused the oil-bleeding phenomenon in which a liquid component exudes from the reflective material 18 and the transparent material 19 toward outside surfaces of the exemplary embodiments 1 and 2, and in which cracks can also be caused on the outside surfaces of devices.

However, in the conventional embodiment, in which the reflective material having A-hardness of 53 is used as the reflective material 18, and which is the same as the first layer of the exemplary embodiment 1 without the transparent material 19 of the second layer, after the reliability test, the liquid component leaked from the reflective material 18 toward an outside surface of the device, although cracks did not occur on the outside surface of the device.

In the comparative embodiment 1, the reflective material having A-hardness of 10 (under JIS-A standard) is used as the reflective material 18, and a transparent material having A-hardness of 53, which includes the filler as the reflective substance, is used as the transparent material 19. In the comparative embodiment 2, the reflective material having A-hardness of 53 is used as the reflective material 18, and a transparent material having A-hardness of 75, which includes the filler as the reflective substance and a small amount of the plasticizer, is used as the transparent material 19 of the second layer.

Additionally, the comparative embodiment 3 includes the reflective material having A-hardness of 10, which is the same as the reflective material 18 of the comparative embodiment 1, and the transparent material having A-hardness of 75, which is the same as the transparent material 19 of the comparative embodiment 2. With respect to other structures except for the reflective material 18 and the transparent material 19, the above-described embodiments are the same as the structure described above with reference to the embodiment of FIG. 1.

As described in FIG. 2, which shows the evaluation result after the reliability test, the comparative embodiment 1 caused a large amount of the liquid component to leak from the reflective material 18 toward the outside surface of the device, although it did not cause cracks on the outside surface of the device. The comparative embodiments 2 and 3 caused not only the liquid components to leak from the reflective materials 18 toward each of the outside surface of the devices, but also caused cracks to form on each of the outside surface of the devices, respectively.

Considerations with respect to an occurrence of the liquid component that is leaked from the reflective material 18 of the first layer will now be described. It may be estimated that a component of the plasticizer, which acts to soften the base material of the reflective material 18, is probably a principal component of the transparent liquid component that bleeds from the reflective material 18. When the reflective material 18 is solidified during a manufacturing process as described later, the plasticizer may not respond to the base material of the reflective material 18, but may have been included as a separative element in the reflective material 18.

When the reflective material 18 including the reflective substance has been subjected to a high light-intensity emitted from the semiconductor light-emitting chip 13 under a high temperature, because resolution of an associated methyl in the side chain may be facilitated, the liquid component may be leaked from the resolved region of the reflective material 18. In this case, a photocatalytic effect of the filler used as the reflective substance, which is included in the reflective material 18, may further promote the resolution of the associated methyl in the side chain.

Furthermore, the reflective substance which can have a photocatalytic action (such as the titanium oxide, the tantalum oxide and the niobium oxide) can promote the resolution of the associated methyl in the side chain. In addition, when the reflective material 18 includes a resolvable radical such as some radicals including alkyl and phenyl except the associated methyl in the side chain, such a reflective substance in the reflective material 18 may also promote the resolution in common with the above-described reflective substance having a photocatalytic action. In the conventional embodiment and the comparative embodiments 1 to 3, in which the liquid components that are leaked from the reflective materials 18 were observed, the base materials of the reflective materials 18 were resolved near the semiconductor light-emitting chips 13, which generate a large amount of light and heat.

One reason why the exemplary embodiments 1 and 2 did not cause the transparent liquid components that exude from the reflective materials 18 toward the outside surfaces may be because the transparent materials 19 may not be resolved due to the absence of a reflective substance therein, respectively. In addition, each of the exemplary embodiments 1 and 2 can increase an amount of the transparent liquid component that is leaked from the transparent material 19 because an amount of the plasticizer contained in the transparent material 19 may become small in each of the exemplary embodiments 1 and 2.

Moreover, the transparent material 19 does not include the filler used as the reflective substance in each of the exemplary embodiments 1 and 2, and therefore can maintain a low hardness. Accordingly, the transparent material 19 can easily prevent the cracks from occurring, and thereby can cover routes that would otherwise leak the transparent liquid component toward the outside surface therewith when the transparent liquid component bleeds from the reflective material 18. Thus, it can be understood that each of the exemplary embodiments 1 and 2 did not exhibit a transparent liquid component that exudes from the reflective material 18 toward the outside surface of the reflective material 18.

With respect to the exemplary embodiment 2, in which the hardness of the reflective material 18 of the first layer is A-hardness of 10, the reliability test was conducted under a presumption, in which the exemplary embodiment 2 may cause the oil-bleeding phenomenon such that the transparent liquid component bleeds from the reflective material 18 on the top surface of the transparent material 19 because the amount of the resolved material may increase due to a large amount of the plasticizer. However, the transparent liquid component leaked from the reflective material 18 is hardly observed. The reason may be because the transparent material 19 may cover routes that would otherwise leak the transparent liquid component toward the outside surface of the device.

The comparative embodiment 1, in which the reflective material 18 having the A-hardness of 10 is used as the first layer and the transparent material 19 having the A-hardness of 53 is used as the second layer as described above, caused a large amount of leaking of transparent liquid component as compared with the conventional embodiment.

The reason may be because a larger amount of the plasticizer is contained in the first layer as compared to the conventional embodiment which decreases the hardness of the reflective material 18 of the first layer and may bleed as the leaked liquid component, and because the leaked liquid component of the first layer may bleed on the top surface of the transparent material 19 along with the transparent liquid component that is leaked from the second layer. Therefore, the larger the amount of the plasticizers contained in the first and the second layers, the larger the amount of the leaked transparent liquid component may be.

With respect to the comparative embodiment 2, in which the reflective material 18 having the A-hardness of 53 is used as the first layer and the transparent material 19 having the A-hardness of 75 is used as the second layer as described above, cracks occurred on the second layer in addition to the occurrence of the transparent liquid component that leaks on the top surface of the transparent material 19. The reason may be because the reflective material including the filler having the reflective substance and a small of the plasticizer may be used as the second layer.

FIGS. 3a and 3b are a front cross-sectional view and a top view depicting the cracks generated in the comparative embodiment 2, respectively. The cracks 20 are easy to occur at the transparent material 19a of the second layer close to the semiconductor light-emitting chip 13. The cracks 20 can especially occur at a region where the reflective material 18a of the second layer contacts with the side surface of the transparent plate 16, and also can occur in the transparent material 19a of the second layer so as to extend from the side surface of the transparent plate 16 toward the inner surface of the frame 17.

Reasons such that will now be described may be inferred with respect to the existence of cracks 20. Because the transparent material 19a of the second layer is a hard resin having the A-hardness of 75, the material 19a may not be able to expand but instead may chap as the cracks 20 when a thermal expansion is applied to the transparent material 19a. Accordingly, the transparent material 19a may not seal the reflective material 18a due to the cracks 20, and the cracks 20 of the transparent material 19a may become routes to leak the transparent liquid components of the reflective material 18a and the transparent material 19a toward the top surface of the transparent material 19a.

In the comparative embodiment 3 as well as the comparative embodiment 2, the cracks occurred in the transparent material having the A-hardness of 75 including the filler having the reflective substance. Therefore, it may be understood that the large amount of the transparent liquid component generated from the reflective material having the A-hardness of 10 bled via the cracks on the top surface of the transparent plate 16.

As described above, the transparent material 19 of the exemplary embodiment 1 of the disclosed subject matter can steadily cover the top surface of the reflective material 18 including the filler having the reflective substance. The transparent material 19 can be composed of a transparent resin including a small amount of plasticizer without the filler having the reflective substance. The transparent material 19 can seal the reflective material 18, the light-emitting structure, the frame 17 and the mounting board 10 with confidence. The reflective material 18 can improve a light-emitting efficiency by returning light leaked from the light-emitting structure including the semiconductor light-emitting chip 13 toward the transparent plate 16.

Therefore, after the fierce reliability test, even if the oil-bleeding phenomenon such that the transparent liquid component may exude from the reflective material 18 toward the outside surface thereof occurs because of the heat and the light emitted from the semiconductor light-emitting chip 13, the transparent material 19 of the exemplary embodiment 1 can seal the routes that would otherwise leak the transparent liquid component, therefore avoiding the photocatalytic effect. Thus, the disclosed subject matter can provide reliable semiconductor light-emitting devices having a high light-emitting efficiency, which can be maintained at a high quality such that the oil-bleeding phenomenon is prevented or cannot occur even when the devices have been used for a long time under harsh conditions.

An exemplary manufacturing method for the above-described semiconductor light-emitting device will now be described in detail with reference to FIGS. 4a to 4d and FIGS. 5a and 5b. FIGS. 4a to 4d are cross-sectional views showing an exemplary manufacturing process for a semiconductor light-emitting device made in accordance with principles of the disclosed subject matter.

Figure 4A:
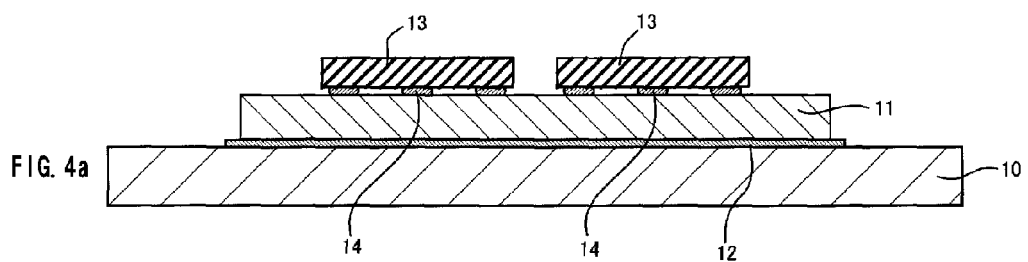
FIGS. 4a to 4d are cross-section views showing an exemplary manufacturing process for a semiconductor light-emitting device made in accordance with principles of the disclosed subject matter.

Process (a) is preparing the mounting board 10 having the mounting surface, the sub mount board 11 having the conductor patterns formed on the mounting surface thereof and the at least one semiconductor light-emitting chip 11, mounting the sub mount board 11 on the mounting surface of the mounting board 10 via the adhesive material 12, mounting the semiconductor light-emitting chip 11 on the conductor patterns of the sub mount board 11 via the solder bumps 14, as shown in FIG. 4a.

Process (b) is preparing the transparent plate 16 and an uncured wavelength converting material 15b by mixing a base material with a phosphor at a prescribed density, disposing the uncured wavelength converting material 15b on the top surface of the semiconductor light-emitting chip 11 so as to become a predetermined thickness by a printing method, a potting method, etc. and mounting the transparent plate 16 on the uncured wavelength converting material 15b.

Figure 4B:
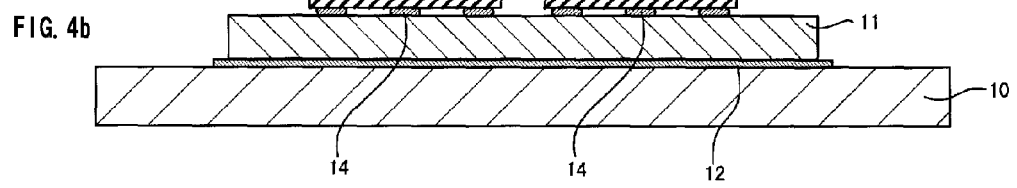

In this case, the transparent plate 16 may be mounted by its own weight or by applying a load, in a direction of an arrow A as shown in FIG. 4b. In addition, in order for the uncured wavelength converting material 15b to form a predetermined uniform thickness between the top surface of the semiconductor light-emitting chip 13 and the bottom surface of the transparent plate 16, the uncured wavelength converting material 15b can include spacers, such as those disclosed in Patent Document No. 5.

In addition, the uncured wavelength converting material 15b may include an inclined surface 150 between the bottom surface of the transparent plate 16 and the side surface of the semiconductor light-emitting chip 13 due to a surface tension while the uncured wavelength converting material 15b covers at least a part of the side surface of the semiconductor light-emitting chip 13. The uncured wavelength converting material 15b may also include an inclined surface 150 that becomes a concave shape toward the wavelength converting layer 15 between the adjacent side surfaces of the semiconductor light-emitting chips 13 due to surface tension of the uncured wavelength converting layer 15.

Figure 4C:
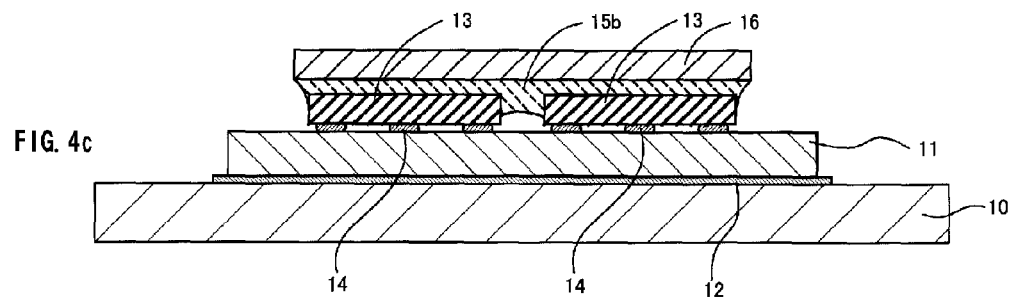

Process (c) is forming the wavelength converting layer 15 described above by solidifying the uncured wavelength converting material 15b under a predetermined curing condition, as shown in FIG. 4c. In this case, if a shape of the uncured wavelength converting material 15b does not vary, before completely solidifying the uncured wavelength converting material 15b, the following process may be carried out in a semi-solidifying state of the uncured wavelength converting material 15b to reduce the manufacturing lead time.

Figure 4D:
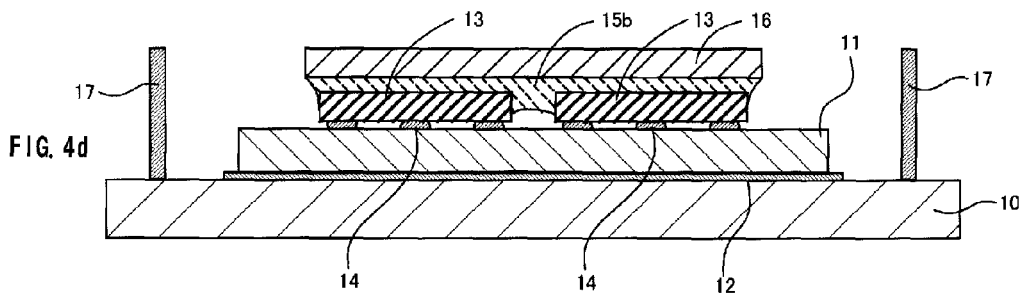

Process (d) is attaching the frame 17 on the outer circumference of the mounting surface of the mounting board 10 via the adhesive material so as to surround the light-emitting structure including the sub mount board 11, the semiconductor light-emitting chip 13, the solder bumps 14, the wavelength converting layer (15b) and the transparent plate 16, as shown in FIG. 4d. In this case, the process for attaching the frame 17 may also be carried out before or simultaneously with the process (b) for mounting the transparent plate 16.

Figure 5A:
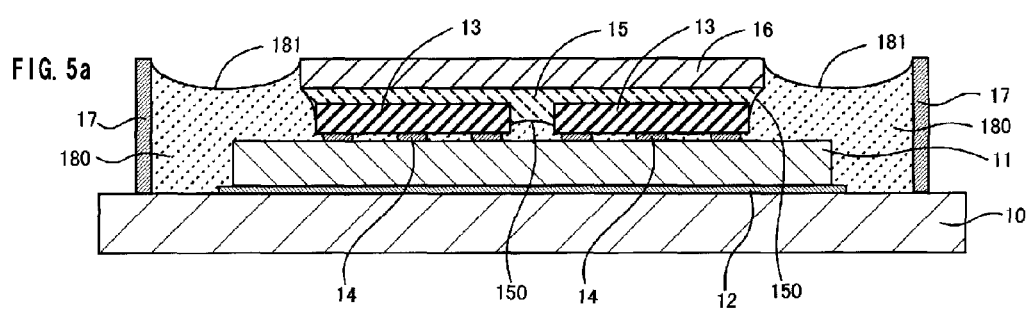
FIGS. 5a and 5b are cross-section views showing an exemplary manufacturing process after the manufacturing process of FIGS. 4a to 4d for the semiconductor light-emitting device made in accordance with principles of the disclosed subject matter.
Figure 5B:
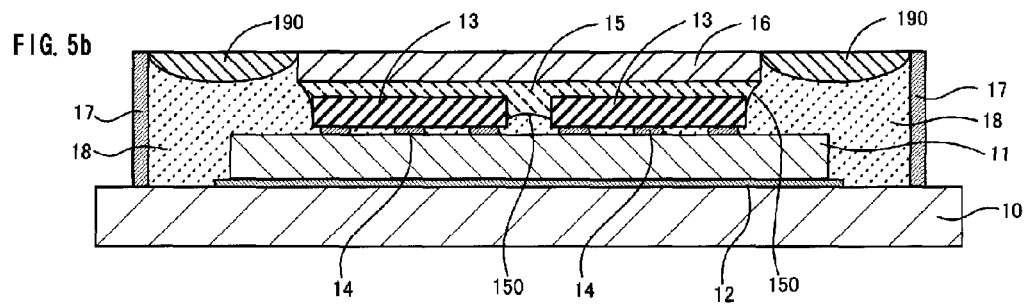

Process (e) is preparing an uncured reflective material 180 by mixing the base material with the filler having the reflective substance, disposing the uncured reflective material 180 between the frame 17 and the light-emitting structure by a potting method and the like so that an inner end of a top surface of the uncured reflective material 180 contacts with a slightly lower position on the side surface of the transparent plate 16 than an edge portion between the top surface and the side surface of the transparent plate 16 and so that a concave meniscus shape 181 is formed on the top surface of the uncured reflective material 180. This method can include forming the reflective material layer 18 including the concave meniscus shape 181 by solidifying the uncured reflective material 180 under a predetermined condition, as shown in FIG. 5a. In this case, the uncured reflective material 180 can be selected in view of the contact angle thereof with respect to the transparent plate 16.

Process (f) is preparing the uncured transparent material 190 by mixing a base material with plasticizer, disposing the uncured transparent material 190 in the concave meniscus shape 181 of the reflective material 18, and forming the transparent material of the second layer on the top surface of the reflective material 18 of the first layer so that the inner end of the top surface of the transparent material contacts with the edge portion on the side surface of the transparent plate 16, by solidifying the uncured transparent material 190 under a predetermined condition, and finishing the semiconductor light-emitting device. The above process steps can be done consecutively and sequentially, or can be interchanged in timing and non-sequential.

In the manufacturing method described above, the uncured reflective material 180 and the uncured transparent material 190 are solidified each by an individual process. However, by adjusting each viscosity of the uncured reflective material 180 and the uncured transparent material 190 so as not to mix with respect to each other, the uncured reflective material 180 and the uncured transparent material 190 can also be solidified at once after disposing the uncured transparent material 190 in the concave meniscus shape 181 of the uncured reflective material 180.

In addition, the uncured wavelength converting material 15b can be disposed between the top surface of the semiconductor light-emitting surface 13 and the bottom surface of the transparent plate 16 and around the side surface of the semiconductor light-emitting chip 13 while the semiconductor light-emitting chip 13 mounted on the sub mount board 11 is directed downward. In this case, the uncured wavelength converting material 15b can be disposed between the top surface of the semiconductor light-emitting chip 13 and the bottom surface of the transparent plate 16 and around the side surface of the semiconductor light-emitting chip 13 by applying the uncured wavelength converting material 15b underneath the top surface of the semiconductor light-emitting chip 13.

Moreover, the uncured wavelength converting material 15b can be disposed between the top surface of the semiconductor light-emitting chip 13 and the bottom surface of the transparent plate 16 and around the side surface of the semiconductor light-emitting chip 13 by applying the uncured wavelength converting material 15b on the bottom surface of the transparent plate 16. The uncured wavelength converting material 15b can also be disposed between the top surface of the semiconductor light-emitting chip 13 and the bottom surface of the transparent plate 16 and around the side surface of the semiconductor light-emitting chip 13 by applying the uncured wavelength converting material 15b both underneath the top surface of the semiconductor light-emitting chip 13 and on the bottom surface of the transparent plate 16.

A shape of the inclined surface 150 of the wavelength converting layer 15 will now be described. The inclined surface 150 can be formed in a convex shape extending in an inward direction towards a center of the semiconductor light-emitting device in order to reflect the crosswise light emitted from the semiconductor light-emitting chip 13 toward the wavelength converting layer 14. In this case, the inclined surface 150 may be formed in a substantially linear shape by increasing an amount of the uncured wavelength converting material 15b, and also may be formed in a concave shape by further increasing the amount of the uncured wavelength converting material 15b.

Figure 6:
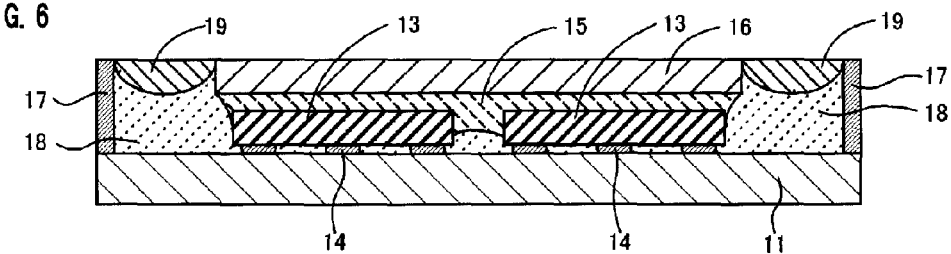
FIG. 6 is a front cross-sectional view showing a second exemplary embodiment of a semiconductor light-emitting device made in accordance with principles of the disclosed subject matter.

Second exemplary embodiments of the disclosed subject matter will now be described with reference to FIG. 6. FIG. 6 is a front cross-sectional view showing the second exemplary embodiment of a semiconductor light-emitting device made in accordance with principles of the disclosed subject matter. A difference between the second embodiment and the first embodiment can become a simple structure by eliminating either the sub mount board 11 or the mounting board 10. A structure, in which the mounting board 10 is eliminated, will now be described.

The semiconductor light-emitting device of the second embodiment can include: the sub mount board 11 having the mounting surface and the conductor patterns (not shown in FIG. 6) formed on the mounting surface, as with the first embodiment; the at least one semiconductor light-emitting chip 13 mounted on the mounting surface of the sub mount board 11 via the solder bumps 14, and each of chip electrodes electrically connected to the respective conductor patterns of the sub mount board 11 via the solder bumps 14, as with the first embodiment; and the wavelength converting layer 15 being located on the top surface of the semiconductor light-emitting chip 13, and the transparent plate 16 being located on the top surface of the wavelength converting layer 15.

In addition, the semiconductor light-emitting device can include; the frame 17 being located along an outer circumference of the sub mount board 11 so as to surround a light-emitting structure, which is composed of the semiconductor light-emitting chip 13, the solder bumps 14, the wavelength converting layer 15 and the transparent plate 16; the reflective material 18 disposed between the frame 17 and the light-emitting structure and also disposed in a space between the bottom surface of the semiconductor light-emitting chip 13 and the mounting surface of the sub mount board 11 so as to surround the solder bumps 14 as a first layer; and the transparent material 19 disposed on the top surface of the reflective material 18 so that the inner side surface thereof contacts with at least the side surface of the transparent plate 16 and so that the outer side surface thereof contacts at least the inner surface of the frame 17, and thereby the transparent material 19 seals the reflective material 18 along with the frame 17 and the light-emitting structure including the transparent plate 16 as the second layer, in common with the first embodiment.

In this case, the reflective material 18 can be disposed between the frame 17 and the light-emitting structure and also disposed in the space between the bottom surface of the semiconductor light-emitting chip 13 and the mounting surface of the sub mount board 11 so as to fill the space between the solder bumps 14 without the mounting board 10. Accordingly, the second embodiment can provide reliable semiconductor light-emitting devices having a high light-emitting efficiency with a simple structure in a small size as compared with the first embodiment.

Figure 7:
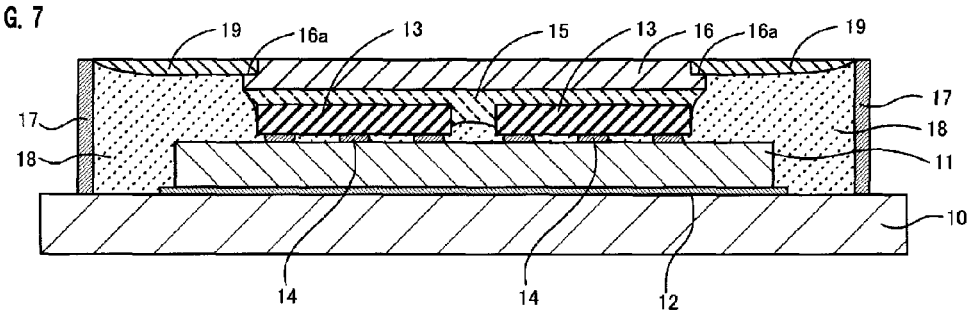
FIG. 7 is a front cross-sectional view showing a third exemplary embodiment of a semiconductor light-emitting device made in accordance with principles of the disclosed subject matter.

Third exemplary embodiments of the disclosed subject matter will now be described with reference to FIG. 7. FIG. 7 is a front cross-sectional view showing the third exemplary embodiment of a semiconductor light-emitting device made in accordance with principles of the disclosed subject matter. A difference between the third embodiment and the first embodiment can result in semiconductor light-emitting devices having a higher reliability by varying a shape of the side surface of the transparent plate 16.

The semiconductor light-emitting device of the third embodiment can include: the mounting board 10 having the mounting surface and the conductor patterns (not shown in FIG. 7) formed on the mounting surface; the sub mount board 11 having the mounting surface and the conductor patterns (not shown in FIG. 7) formed on the mounting surface, and the sub mount board 11 being located on the mounting surface of the mounting board 10 via the adhesive material 12; the at least one semiconductor light-emitting chip 13 having chip electrodes adjacent the bottom surface thereof mounted on the conductor patterns of the sub mount board 11 via the solder bumps 14, and each of the chip electrodes electrically connected to respective conductor patterns of the sub mount board 11 via the solder bumps 14; the wavelength converting layer 15 being located on the top surface of the semiconductor chip 13; and a transparent plate 16 having a first side surface and a second side surface located at least one region between the top surface and the bottom surface, and including a step 16*a* located between the first side surface and the second side surface, and the transparent plate 16 being located on the top surface of the wavelength converting layer 15.

In addition, the semiconductor light-emitting device can include; the frame 17 being located along the outer circumference of the mounting board 10 so as to surround the light-emitting structure, which is composed of the sub mount board 11, the semiconductor light-emitting chip 13, the solder bumps 14, the wavelength converting layer 15 and the transparent plate 16; the reflective material 18 disposed between the frame 17 and the light-emitting structure including the sub mount board 11 so as to contact with at least a part of the second side surface, which is adjacent the bottom surface of the transparent plate 16, and so as not to contact with the first side surface, which is adjacent the top surface of the transparent plate 16, and also disposed in the space between the bottom surface of the semiconductor light-emitting chip 13 and the top surface of the sub mount board 11 so as to surround the solder bumps 14 as a first layer; and the transparent material 19 disposed on the top surface of the reflective material 18 so that the inner side surface thereof contacts with the first side surface of the transparent plate 16, a part of the bottom surface thereof contacts with the step 16*a* of the transparent plate 16 and the outer side surface thereof contacts with the inner surface of the frame 17, and thereby the transparent material 19 seals the reflective material 18 along with the frame 17 and the light-emitting structure including the transparent plate 16 as the second layer.

Methods for manufacturing the semiconductor light-emitting device of the third embodiment can be substantially the same as those for the first embodiment described in FIGS. 4*a* to 5*b*. In the disposing process (e) of the uncured reflective material 180, the third embodiment can easily prevent the uncured reflective material 180 from covering the whole circumference of the transparent plate 16 due to surface tension, and therefore can enable the uncured transparent material 190 to completely cover the top surface of the reflective material 18 while contacting with the first surface and the step of the transparent plate 16 with confidence in the disposing process (f) of the uncured transparent material 190.

According to the above semiconductor light-emitting device, a distance between the top surface of the reflective material 18 and the top surfaces of the transparent plate 16 and the transparent material 19 can be longer as compared with the first embodiment. Therefore, the third embodiment can provide semiconductor light-emitting devices having a higher reliability because the transparent material 19, which is also disposed on the step of the transparent plate 16, can prevent the occurrence of the oil-bleeding phenomenon which may degrade the optical characteristics of the semiconductor light-emitting device.

In addition, the semiconductor light-emitting device may also emit darker light than light that is emitted from the top surface of the transparent plate 16 by actively leading light from the transparent plate 16 by increasing a thickness of the transparent material 19. Accordingly, the third embodiment can provide a semiconductor light-emitting device having a wide light-emitting surface in which lighting characteristics become darker toward the frame 17, that is to say, having a light distribution that becomes gradually dark toward the outside of the device. Therefore, the semiconductor light-emitting device may be effectively used as a light source for the tunnel lighting unit, etc.

Moreover, the first and the second surfaces of the transparent plate 16 may not necessarily be provided about a whole circumference of the transparent plate 16. For example, one side can be configured as the structure of the first embodiment, and an other round side can be configured as the structure of the third embodiment. In this case, the one side can be provided to form a horizontal cut-off line as described in FIG. 12 later.

In the third embodiment, a case where the first surface is located within the second surface is described. However, the second surface may be located within the first surface. In this case, the reflective material 18 may contact with the step 16*a*, which is located within the first surface of the transparent plate 16 and also is located between the first surface and the second surface.

Figure 8:
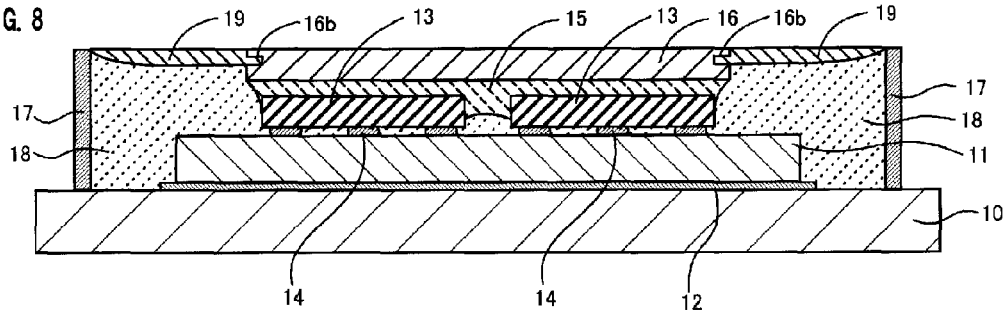
FIG. 8 is a front cross-section view showing a fourth exemplary embodiment of a semiconductor light-emitting device made in accordance with principles of the disclosed subject matter.

Fourth exemplary embodiments of the disclosed subject matter will now be described with reference to FIG. 8. FIG. 8 is a front cross-sectional view showing the fourth exemplary embodiment of a semiconductor light-emitting device made in accordance with principles of the disclosed subject matter. A difference between the fourth embodiment and the third embodiment can result in semiconductor light-emitting devices which are easier to lead light from the transparent plate 16, in addition to a higher reliability device, by further varying the shape of the side surface of the transparent plate 16.

The semiconductor light-emitting device of the fourth embodiment can include a transparent plate 16 which is provided with a concave portion 16*b* hollowing in an inner direction of the transparent plate 16. The transparent material 19 can enter into the concave portion 16*b* of the transparent plate 16, and can connect to the transparent plate 16. The reflective material 18 can also contact with a part of the side surface, which is located from the concave portion 16*b* of the transparent plate 16 toward the wavelength converting layer 15. Accordingly, the transparent material 19 can cover the top surface of the reflective material 18 with confidence while the transparent material increases a contacting area with the transparent plate 16.

Thereby, the transparent material 19 of the fourth embodiment can prevent the occurrence of the oil-bleeding phenomenon which may degrade the optical characteristics and/or outside appearance of the semiconductor light-emitting device. The fourth embodiment can provide semiconductor light-emitting devices having a higher reliability as compared with the third embodiment. In addition, the semiconductor light-emitting device may actively lead the light from the transparent plate 16 because of the increase of the contacting area with the transparent plate 16. Accordingly, the fourth embodiment can provide reliable semiconductor light-emitting devices having a wide light-emitting surface such that light characteristics becomes dark toward the frame 17, and can provide reliable devices having a light distribution that is slightly brighter on the transparent material 19 as compared with the third embodiment.

The concave portion 16b may not necessarily be provided about the whole circumference of the transparent plate 16. For example, a part of the side surface can be configured as the structure of the third embodiment, and other side can be configured as the structure of the fourth embodiment. Thus, the semiconductor light-emitting device of the fourth embodiment may be used not only as a light source for the headlight and the tunnel lighting unit, but also as a light source for a lighting unit of a show window and the like which can vary a light-emitting intensity according to an illuminating area.

In the fourth embodiment, a case where the concave portion 16b is located in the inner direction of the transparent plate 16 is described. However, the concave portion 16b may be located in an outer direction of the transparent plate 16, that is to say, a convex portion that projects in the outer direction of the transparent plate 16 can also be employed in the fourth embodiment. In this case, the reflective material 18 may contact with one surface of the convex portion, which is located toward the bottom surface of the transparent plate 16.

In the above-described embodiments, cases in which the transparent material 19 are disposed on the top surface of the reflective material 18 so as to fill in the concave surface of the reflective material 18, are described. However, the reflective material 18 does not need the concave surface, but the transparent material 19 may be disposed on a substantially plane surface of the top surface if the transparent material 19 can cover the top surface of the reflective material 18 with confidence.

Figure 9:
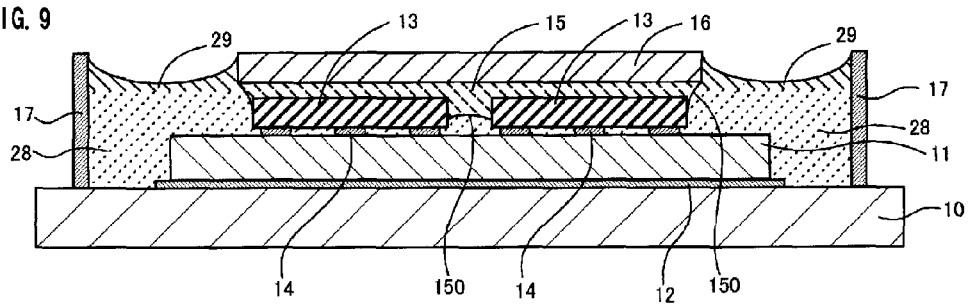
FIG. 9 is a front cross-sectional view showing a fifth exemplary embodiment of a semiconductor light-emitting device made in accordance with principles of the disclosed subject matter.

Fifth exemplary embodiments of the disclosed subject matter will now be described with reference to FIG. 9. FIG. 9 is a front cross-sectional view showing a fifth exemplary embodiment of a semiconductor light-emitting device made in accordance with principles of the disclosed subject matter. A difference between the fifth embodiment and the first embodiment is to integrate a transparent material 29 into a reflective material 28 in the fifth embodiment. In this case, an amount of the filler, which is used as the reflective substance contained in the transparent material 29, can be very small as compared with that contained in the reflective material 28.

Methods for manufacturing the semiconductor light-emitting device of the fifth embodiment can be substantially the same as those for the first embodiment described in FIGS. 4a to 5b until the disposing process (e) of the uncured reflective material 180. After that, the filler used as the reflective substance is precipitated by a centrifugal machine and the like (not shown in FIGS. 5a and 5b) in the manufacturing method for the fifth embodiment. In this case, after precipitating the filler having the reflective substance in the uncured reflective material 180, the uncured reflective material 180 can be heated at approximately 50 degrees centigrade for approximately one hour, and then the uncured reflective material 180 can become two layers, which are a reflective material 28 and a transparent material 29.

In the fifth embodiment, an uncured reflective material, in which the filler of 20 to 30 weight percent is mixed as the reflective substance, can be used as the uncured reflective material 180. The transparent material 29 including the filler of 3 weight percent or less can be formed on the reflective material 28 as the second layer by the precipitating process. Each transparence of the reflective material 28 and the transparent material 29 can be adjusted by an operating time and the number of revolutions of the centrifugal machine and a heating time of the approximately 50 degrees centigrade.

With respect to a boundary between the reflective material 28 and the transparent material 29, a layer including a large amount of the reflective substance toward the mounting board 10 can be defined as the reflective material 28 of the first layer, and another layer including a very small amount of the reflective substance opposite the mounting board 10 can be defined as the transparent material 29 of the second layer. More specifically, because the reflective material 28 includes the large amount of the filler reflective substance, and the transparent material 29 hardly includes the filler reflective substance, a hardness of the reflective material 28 can become larger than that of the transparent material 29.

Thus, the boundary between the reflective material 28 and the transparent material 29 can be defined as a substantially different surface between the hardness of the reflective material 28 and the transparent material 29. Other structures of the fifth embodiment can be the same as the first embodiment. Thus, the fifth embodiment can provide reliable semiconductor light-emitting devices having substantially the same characteristics as the first embodiment while eliminating the disposing process (f) of the uncured transparent material 190.

As described above, the light emitted from the semiconductor light-emitting chip 13 can enter into the transparent plate 16 via the wavelength converting layer 15, directly or reflected by the reflective material layer 18. Therefore, the semiconductor light-emitting device can emit a different wavelength light from that of the semiconductor light-emitting chip 13 by use of an additive color mixture of part of the light emitted from the semiconductor light-emitting chip 13 and the wavelength-converted light excited by another part of the light via the wavelength converting layer 15. Light emitted in a crosswise direction from the semiconductor light-emitting chip 13 and the wavelength converting layer 15 can be reflected into the reflective material 18, and finally can be emitted from the top surface of the transparent plate 16.

Therefore, the above-described embodiments of the disclosed subject matter can provide reliable semiconductor light-emitting deices for a vehicle headlight and the like, which can prevent the oil-bleeding phenomenon which may degrade the optical characteristics and/or the outside appearance of the light-emitting device. Thus, the devices can be maintained at a high quality even when used for a long time under harsh conditions.

In addition, the above-described embodiments of the disclosed subject matter can also provide a small semiconductor light-emitting device having a small light-emitting surface, which is the top surface of the transparent plate 16. The semiconductor light-emitting device can also form various light distribution patterns having a second light-emitting surface by using the transparent material 19 as described in the third and the forth embodiments.

Moreover, because the reflective material 18 can be formed in a reflector shape that extends from the semiconductor light-emitting chip 13 in a light-emitting direction of the semiconductor light-emitting device, the light emitted in the crosswise direction of the semiconductor light-emitting chip 13 and the wavelength converting layer 15 can be reflected toward the bottom surface of the transparent plate 16, and also the light emitted in downward direction of the semiconductor light-emitting chip 13 can be reflected toward the wavelength converting layer 15 at the bottom surface of the semiconductor light-emitting chip 13 by the reflective material 18, which is disposed between the bottom surface of the semiconductor light-emitting chip 13 and the mounting surface of the mounting board 10 so as to surround the bumps 14. Thus, the embodiments of the disclosed subject matter can also provide a reliable semiconductor light-emitting device having a high light-emitting efficiency.

According to the embodiments of the disclosed subject matter, the inclined surface 150 of the reflective material 18 can be formed in a prescribed shape by disposing the uncured reflective material 180 between the frame 17 and the light-emitting structure including the wavelength converting layer 15, and the reflective material 18 can be attached to at least the side surfaces of the wavelength converting layer 15. Thereby, the reflector shape having a predetermined shape can also be formed from the side surface of the semiconductor light-emitting chip 13 to the bottom surface of the transparent plate 16 without a machining process.

In addition, the manufacturing method can also dispose the reflective material 18 in the space between the bottom surface of the semiconductor light-emitting chip 13 and the mounting surface of the mounting board 10 when disposing the uncured reflective material 180 between the frame 16 and the light-emitting structure. Accordingly, the manufacturing method can improve a light-emitting efficiency. Moreover, when the filler used as the reflective substance is precipitated by a machine such as the centrifugal machine as described in the fifth embodiment, the transparent material 29 and the reflective material 28 can also be formed by the same material at once.

Figure 10:
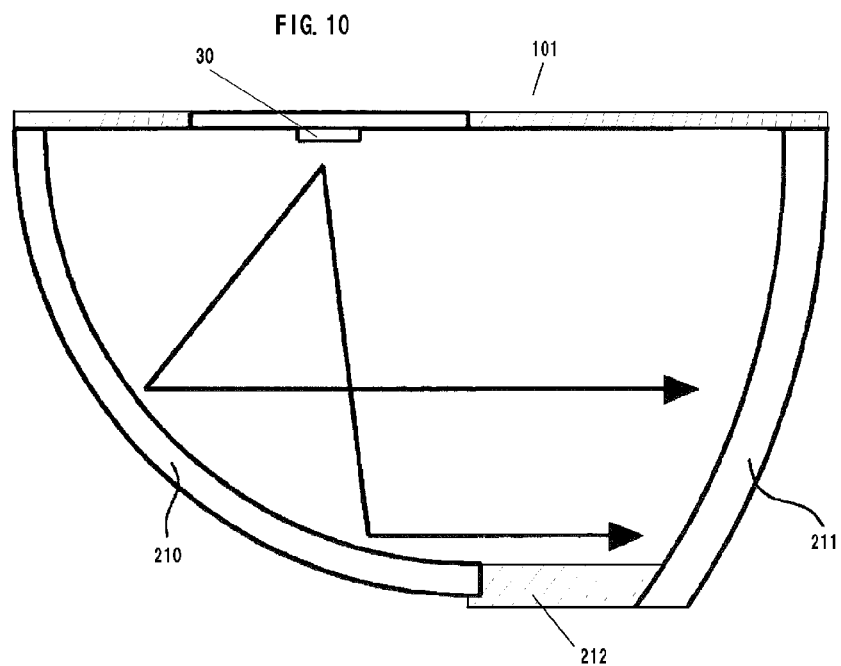
FIG. 10 is a schematic structural cross-sectional view depicting a first exemplary embodiment of a vehicle headlight using a semiconductor light-emitting device made in accordance with principles of the disclosed subject matter.

Exemplary embodiments of a vehicle headlight using the above-described semiconductor light-emitting device will now be described with reference to FIGS. 10 to 12. FIG. 10 is a schematic structural cross-sectional view depicting a first exemplary embodiment of a vehicle headlight using the semiconductor light-emitting device made in accordance with principles of the disclosed subject matter. The vehicle headlight is an exemplary reflector typed headlight.

The vehicle headlight 101 can include: at least one revolved parabolic reflector 210 having a central axis, a focus located on the central axis and an opening; the semiconductor light-emitting device 30 having an optical axis located substantially at (i.e., at or almost at) the focus of the parabolic reflector 210 so that the optical axis thereof intersects with the central axis of the parabolic reflector 210; an outer lens 211 being located in front of the opening of the parabolic reflector 210 so as to cover the opening of the parabolic reflector 210; and a housing 212 being located adjacent the parabolic reflector 210, the outer lens 211 and the semiconductor light-emitting device 30.

In this case, one light-emitting device of the first, second, third, fourth and fifth embodiments can be used as the semiconductor light-emitting device 30. Light emitted from the semiconductor light-emitting device 30 can be reflected by the parabolic reflector 210, and can be emitted in a direction toward a light-emission of the headlight 101 via the outer lens 211. The vehicle headlight 101 can be provided with the semiconductor light-emitting device having a high reliability, which can be maintained at a high quality even when it has been used for a long time under a harsh condition as described above. Thus, the first embodiment can provide reliable vehicle headlights even when the semiconductor light-emitting device 30 has been emitted for a long time in the small sealed housing 212.

Figure 11:
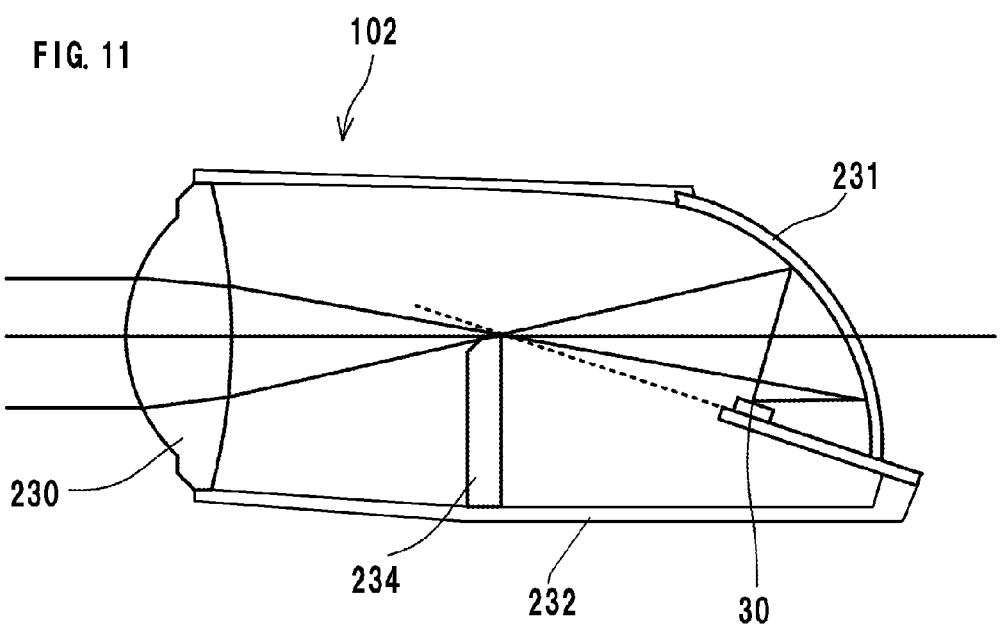
FIG. 11 is a schematic structural cross-sectional view showing a second exemplary embodiment of a vehicle headlight using a semiconductor light-emitting device made in accordance with principles of the disclosed subject matter.

FIG. 11 is a schematic structural cross-sectional view showing a second exemplary embodiment of a vehicle headlight using a semiconductor light-emitting device made in accordance with principles of the disclosed subject matter. The vehicle headlight 102 is an exemplary projector typed headlight for a low beam.

The vehicle headlight can include: at least one ellipsoidal reflector 231 having a central axis, a first focus and a second focus located on the substantially central axis; the semiconductor light-emitting device 30 having an optical axis located substantially at (i.e., at or almost at) the first focus of the ellipsoidal reflector 231 so that the optical axis intersects with the central axis of the ellipsoidal reflector 231: a projector lens 230 having an optical axis and at least one focus located toward the ellipsoidal reflector 231 on the optical axis of the projector lens 230 so that the optical axis thereof corresponds substantially to the central axis of the ellipsoidal reflector 231 and the focus thereof is located substantially at the second focus of the ellipsoidal reflector 231; a shade 234 having a top surface located between the projector lens 230 and the ellipsoidal reflector 231 so that the top surface thereof is located substantially at the second focus of the ellipsoidal reflector 231; and an housing 232 being located adjacent the projector lens 230 and the ellipsoidal reflector 231.

In this case, one light-emitting device of the first, second, third, fourth and fifth embodiments can also be used as the semiconductor light-emitting device 30. Light emitted from the semiconductor light-emitting device 30 can be reflected by the ellipsoidal reflector 231, and can be emitted in a direction toward a light-emission of the headlight 102 via the projector lens 230. The vehicle headlight can shade an upward light which is reflected from the ellipsoidal reflector and is directly emitted from the semiconductor light-emitting device 30 toward the projector lens 230, and therefore can be used for a low beam headlight.

The vehicle headlight 101 can also be provided with the semiconductor light-emitting device having a high reliability, which can be maintained at a high quality even when it has been used for a long time under harsh conditions, as described above. Thus, the second embodiment can also provide vehicle headlights having a high reliability even when the semiconductor light-emitting device 30 has been emitting light for a long time in the small sealed housing 232.

Figure 12:
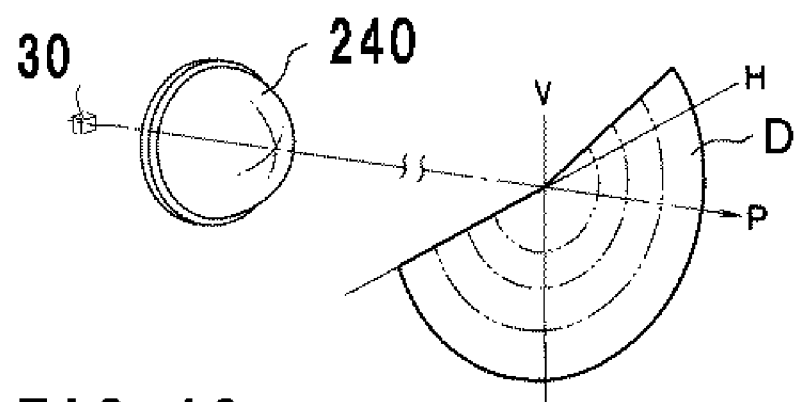
FIG. 12 is a schematic perspective view and a schematic diagram showing a light distribution pattern including a horizontal cut-off line formed by a third exemplary embodiment of a vehicle headlight, wherein only the semiconductor light-emitting device and a projector lens of the vehicle headlight is shown.
Figure 13A:
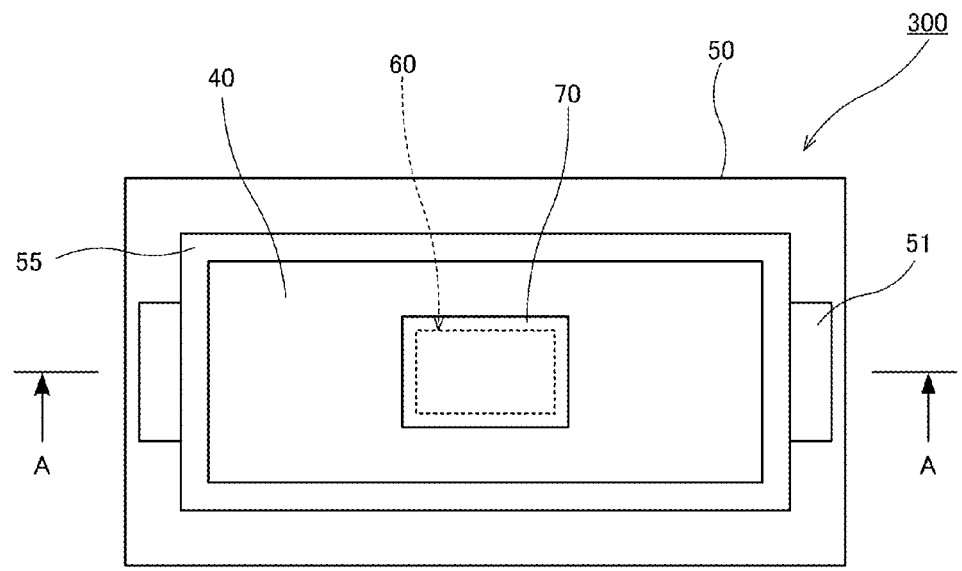
FIGS. 13a and 13b are a schematic top view and a schematic front cross-sectional view showing a conventional semiconductor light-emitting device, respectively.
Figure 13B:
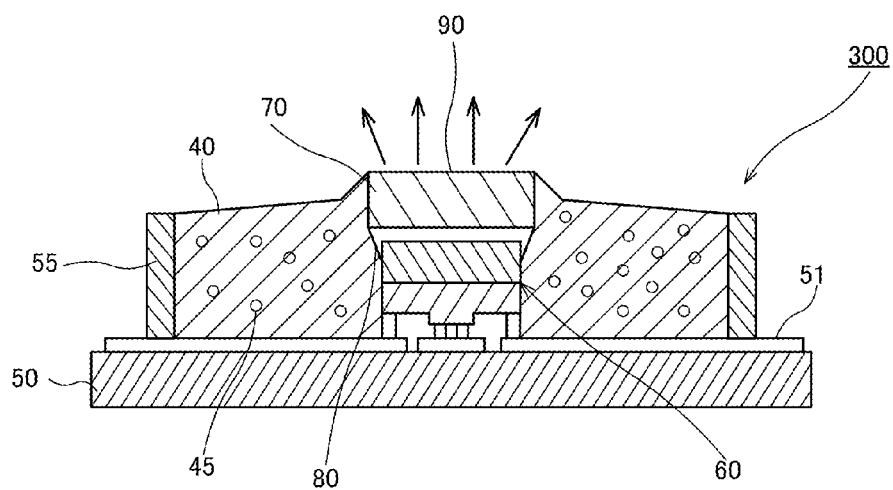

FIG. 12 is a schematic perspective view and a schematic diagram showing a light distribution pattern including a horizontal cut-off line formed by a third exemplary embodiment of a vehicle headlight. The third embodiment is another exemplary projector typed headlight for a low beam, and is an exemplary direct projector type headlight without a reflector. The schematic diagram shows a light distribution pattern D including a horizontal cut-off line for a low beam with respect to a horizontal line H and a vertical line V, which is located substantially perpendicular to a road, and which is formed by the projector headlight. The projector headlight shows only a projector lens 240 having an optical axis P and at least one focus located on the optical axis thereof, and the semiconductor light-emitting device 30 located near the focus of the projector lens 240 so that the optical axis of the semiconductor light-emitting device 30 corresponds substantially to the optical axis P of the projector lens 240, in order to ease an understanding of the projector headlight.

The light distribution pattern D including the horizontal cut-off line can be formed on a virtual vertical screen by the projector headlight using the semiconductor light-emitting device 30. More specifically, light emitted from the semiconductor light-emitting device 30 can be projected on the virtual vertical screen in reverse with respect to the vertical line V. Accordingly, as described in the second embodiment, by forming one side of the light-emitting surface of the semiconductor light-emitting device in a line including an elbow line such as the above-described horizontal cut-off line, the light emitted from the semiconductor light-emitting device 30 can form the light distribution pattern D via the projector lens 240.

In this case, the semiconductor light-emitting device can be used as a light source for a vehicle headlight including a low beam by enlarging a light distribution pattern emitted from the light-emitting surface of the device and by forming the light-emitting line having a higher contrast, by using a shading mask near the light-emitting surface of the device if necessary. In addition, the light distribution pattern can be formed in various shapes as described above. Therefore, the semiconductor light-emitting device of the disclosed subject matter can be used as a light source for various vehicle lamps such as the headlight, a tail lamp, etc.

As described above, the disclosed subject matter is not only directed to devices that form a light-emitting surface in a small shape such that is slightly larger than the top surface of the semiconductor light-emitting chip 13. The disclosed subject matter is also directed to devices having a light-emitting surface in a slightly large shape by using the second light-emitting surface of the transparent material 19, and which can improve a light-emitting efficiency by using the side surface of the reflective material 18 as a reflector for the light-emitting chip 13. Thus, the disclosed subject matter can provide a semiconductor light-emitting device having a high reliability and a high light-emitting efficiency, which can be used for lighting units such as a vehicle headlight, a tunnel lighting and the like, which must be maintained at a high quality even when they have been used for a long time under harsh conditions.

Moreover, for example, the semiconductor light-emitting device can be manufactured by disposing the uncured reflective material 180 between the frame 17 and at least the light-emitting structure and by disposing the uncured transparent material 190 on the top surface of the reflective material 18 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 13 with the wavelength converting layer 15 including at least one phosphor, and therefore can also be used as a light source device for various applications such as general lighting, a street light, stage lighting, traffic lights, etc. In addition, it is conceived that each of the different aspects and features of the different embodiments disclosed herein could be used interchangeably in and with the other disclosed embodiments. Moreover, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
a mounting board having a mounting surface;
a sub mount board having a mount surface and a conductor pattern located adjacent the mount surface of the sub mount board, and the sub mount board being located adjacent the mounting surface of the mounting board;
at least one semiconductor light-emitting chip having a top surface, a side surface and a bottom surface, and including chip electrodes adjacent the bottom surface, each of the chip electrodes electrically connected to a respective portion of the conductor pattern of the sub mount board via solder bumps;
a transparent plate having a top surface, a side surface, a bottom surface and an edge portion located between the top surface and the side surface, the transparent plate being located over the top surface of the at least one semiconductor light-emitting chip so that the bottom surface of the transparent plate covers the top surface of the at least one semiconductor light-emitting chip;
a wavelength converting layer having a side surface and including at least one phosphor, the wavelength converting layer disposed between the bottom surface of the transparent plate and the side surface of the at least one semiconductor light-emitting chip so that the side surface of the wavelength converting layer extends from the side surface of the at least one semiconductor light-emitting chip toward the bottom surface of the transparent plate;
a frame located adjacent the mounting surface of the mounting board so as to surround the sub mount board, the at least one semiconductor light-emitting chip, the wavelength converting layer and the transparent plate;
a reflective material having a top surface, a side surface and an end of the top surface, the top surface of the reflective material including at least one of a concave shape and a planer shape, the side surface including an inclined surface, the reflective material disposed at least between the frame and both a part of the side surface of the transparent plate and the side surface of the wavelength converting layer and between the bottom surface of the at least one semiconductor light-emitting chip and the mount surface of the sub mount board while surrounding the solder bumps, the inclined surface of the side surface of the reflective material contacting with the side surface of the wavelength converting layer and extending from the side surface of the at least one semiconductor light-emitting chip toward the bottom surface of the transparent plate, the end of the top surface of the reflective material contacting with the side surface of the transparent plate, and the reflective material having a hardness and configured as a resin including a reflective substance filler; and
a transparent material having a top surface, an end of the top surface, a side surface, a bottom surface and a hardness different from the hardness of the reflective material, the transparent material disposed on the top surface of the reflective material so as to cover the whole top surface of the reflective material while the end of the top surface of the transparent material contacts with the side surface of the transparent plate, and the transparent material being configured as a resin including substantially no reflective substance filler.

2. A semiconductor light-emitting device comprising:
a sub mount board having a mount surface and a conductor pattern located adjacent the mount surface;

at least one semiconductor light-emitting chip having a top surface, a side surface and a bottom surface, and including chip electrodes adjacent the bottom surface, each of the chip electrodes electrically connected to a respective portion of the conductor pattern of the sub mount board via solder bumps;

a transparent plate having a top surface, a side surface, a bottom surface and an edge portion located between the top surface and the side surface, the transparent plate being located over the top surface of the at least one semiconductor light-emitting chip so that the bottom surface of the transparent plate covers the top surface of the at least one semiconductor light-emitting chip;

a wavelength converting layer having a side surface and including at least one phosphor, the wavelength converting layer disposed between the bottom surface of the transparent plate and the side surface of the at least one semiconductor light-emitting chip so that the side surface of the wavelength converting layer extends from the side surface of the at least one semiconductor light-emitting chip toward the bottom surface of the transparent plate;

a frame located adjacent the mount surface of the sub mount board so as to surround the at least one semiconductor light-emitting chip, the wavelength converting layer and the transparent plate;

a reflective material having a top surface, a side surface and an end of the top surface, the top surface of the reflective material including at least one of a concave shape and a planer shape, the side surface including an inclined surface, the reflective material disposed at least between the frame and both a part of the side surface of the transparent plate and the side surface of the wavelength converting layer and between the bottom surface of the at least one semiconductor light-emitting chip and the mount surface of the sub mount board while surrounding the solder bumps, the inclined surface of the side surface of the reflective material contacting with the side surface of the wavelength converting layer and extending from the side surface of the at least one semiconductor light-emitting chip toward the bottom surface of the transparent plate, the end of the top surface of the reflective material contacting with the side surface of the transparent plate, and the reflective material having a hardness and configured as a resin including a reflective substance filler; and a transparent material having a top surface, an end of the top surface, a side surface, a bottom surface and a hardness different from the hardness of the reflective material, and disposed on the top surface of the reflective material so as to cover the whole top surface of the reflective material while the end of the top surface of the transparent material contacts with the side surface of the transparent plate, and the transparent material being configured as a resin including substantially no reflective substance filler.

3. The semiconductor light-emitting device according to claim 1, wherein the side surface of the transparent plate is composed of a first side surface adjacent the top surface of the transparent plate and a second side surface adjacent the bottom surface of the transparent plate, the end of the top surface of the reflective material contacts with the second side surface of the transparent plate, and the end of the top surface of the transparent material contacts with the first side surface of the transparent plate.

4. The semiconductor light-emitting device according to claim 2, wherein the side surface of the transparent plate is composed of a first side surface adjacent the top surface of the transparent plate and a second side surface adjacent the bottom surface of the transparent plate, the end of the top surface of the reflective material contacts with the second side surface of the transparent plate, and the end of the top surface of the transparent material contacts with the first side surface of the transparent plate.

5. The semiconductor light-emitting device according to claim 1, wherein the side surface of the transparent plate includes at least one of a concave portion and a convex portion, the side surface of the transparent material contacts with the at least one of the concave portion and the convex portion, and the top surface of the reflective material contacts with the bottom surface of the transparent material and the side surface of the transparent plate.

6. The semiconductor light-emitting device according to claim 2, wherein the side surface of the transparent plate includes at least one of a concave portion and a convex portion, the side surface of the transparent material contacts with the at least one of the concave portion and the convex portion, and the top surface of the reflective material contacts with the bottom surface of the transparent material and the side surface of the transparent plate.

7. The semiconductor light-emitting device according to claim 1, wherein the hardness of the reflective material is larger than the hardness of the transparent material.

8. The semiconductor light-emitting device according to claim 2, wherein the hardness of the reflective material is larger than the hardness of the transparent material.

9. The semiconductor light-emitting device according to claim 1, wherein the at least one semiconductor light-emitting chip and the at least one phosphor are one combination of
the at least one semiconductor light-emitting chip is a blue light-emitting chip and the at least one phosphor of the wavelength converting layer is selected from the group consisting of a yellow phosphor, and two phosphors including a red phosphor layer and a green phosphor layer, and
the at least one semiconductor light-emitting chip is an ultraviolet light-emitting chip and the at least one phosphor of the wavelength converting layer includes at least one of a red phosphor layer, a green phosphor layer and a blue phosphor.

10. The semiconductor light-emitting device according to claim 2, wherein the at least one semiconductor light-emitting chip and the at least one phosphor are one combination of
the at least one semiconductor light-emitting chip is a blue light-emitting chip and the at least one phosphor of the wavelength converting layer is selected from the group consisting of a yellow phosphor, and two phosphors including a red phosphor layer and a green phosphor layer, and
the at least one semiconductor light-emitting chip is an ultraviolet light-emitting chip and the at least one phosphor of the wavelength converting layer includes at least one of a red phosphor layer, a green phosphor layer and a blue phosphor.

11. A vehicle headlight including the semiconductor light-emitting device according to claim 9, further comprising:
a housing;
at least one parabolic reflector having a central axis, an opening and a focus located on the central axis, and located adjacent the housing, and the focus of the parabolic reflector being located substantially at the semiconductor light-emitting device so that an optical axis of the semiconductor light-emitting device intersects with the central axis of the parabolic reflector; and an outer lens being located in front of the opening of the parabolic reflector so as to cover the opening of the parabolic reflector.

12. A vehicle headlight including the semiconductor light-emitting device according to claim 10, further comprising:
a housing;
at least one parabolic reflector having a central axis, an opening and a focus located on the central axis, and located adjacent the housing, and the focus of the parabolic reflector being located substantially at the semiconductor light-emitting device so that an optical axis of the semiconductor light-emitting device intersects with the central axis of the parabolic reflector; and
an outer lens being located in front of the opening of the parabolic reflector so as to cover the opening of the parabolic reflector.

13. A vehicle headlight including the semiconductor light-emitting device according to claim 9, further comprising:
a housing;
at least one ellipsoidal reflector having a central axis, a first focus and a second focus located substantially on the central axis, and the reflector located adjacent the housing, the first focus of the ellipsoidal reflector being located substantially at the semiconductor light-emitting device so that an optical axis of the semiconductor light-emitting device intersects with the central axis of the ellipsoidal reflector;
a projector lens having an optical axis and at least one focus located toward the ellipsoidal reflector on the optical axis, the optical axis of the projector lens corresponding substantially to the central axis of the ellipsoidal reflector, and the focus of the projector lens being located substantially at the second focus of the ellipsoidal reflector; and
a shade having a top surface located between the projector lens and the ellipsoidal reflector, and the top surface of the shade being located substantially at the second focus of the ellipsoidal reflector.

14. A vehicle headlight including the semiconductor light-emitting device according to claim 10, further comprising:
a housing;
at least one ellipsoidal reflector having a central axis, a first focus and a second focus located substantially on the central axis, and the reflector located adjacent the housing, the first focus of the ellipsoidal reflector being located substantially at the semiconductor light-emitting device so that an optical axis of the semiconductor light-emitting device intersects with the central axis of the ellipsoidal reflector;
a projector lens having an optical axis and at least one focus located toward the ellipsoidal reflector on the optical axis, the optical axis of the projector lens substantially corresponding to the central axis of the ellipsoidal reflector, and the focus of the projector lens being located substantially at the second focus of the ellipsoidal reflector; and
a shade having a top surface located between the projector lens and the ellipsoidal reflector, and the top surface of the shade being located substantially at the second focus of the ellipsoidal reflector.

15. A vehicle headlight including the semiconductor light-emitting device according to claim 9, further comprising:
a projector lens having an optical axis and at least one focus located on the optical axis, the optical axis substantially corresponding to an optical axis of the semiconductor light-emitting device, and the focus of the projector lens being located substantially at the semiconductor light-emitting device.

16. A vehicle headlight including the semiconductor light-emitting device according to claim 10, further comprising:
a projector lens having an optical axis and at least one focus located on the optical axis, the optical axis substantially corresponding to an optical axis of the semiconductor light-emitting device, and the focus of the projector lens being located substantially at the semiconductor light-emitting device.

17. A method for manufacturing the semiconductor light-emitting device according to claim 1, comprising:
providing the mounting board, in which the sub mount board includes the at least one semiconductor light-emitting device mounted thereon, the wavelength converting layer and the transparent plate are located on the mounting board and the frame is also located on the mounting board so as to surround the sub mount board;
disposing an uncured reflective material having the filler between the frame and the side surfaces of the at least one semiconductor light-emitting device, the wavelength converting layer and the transparent plate; and
disposing an uncured transparent material on the top surface of the reflective material layer.

18. A method for manufacturing the semiconductor light-emitting device according to claim 1, comprising:
providing the mounting board, in which the sub mount board includes the at least one semiconductor light-emitting device mounted thereon, the wavelength converting layer and the transparent plate are located on the mounting board and the frame is also located on the mounting board so as to surround the sub mount board;
disposing an uncured reflective material having the filler between the frame and the side surfaces of the at least one semiconductor light-emitting device, the wavelength converting layer and the transparent plate; and
precipitating the filler in the uncured reflective material.

19. A method for manufacturing the semiconductor light-emitting device according to claim 2, comprising:
providing the sub mount board, adjacent which the at least one semiconductor light-emitting device, the wavelength converting layer, and the transparent plate are located, and the frame is mounted on the sub mount board so as to surround the at least one semiconductor light-emitting chip;
disposing an uncured reflective material having the filler between the frame and the side surfaces of the at least one semiconductor light-emitting device, the wavelength converting layer and the transparent plate; and
disposing an uncured transparent material on the top surface of the reflective material.

20. A method for manufacturing the semiconductor light-emitting device according to claim 2, comprising:
providing the sub mount board, adjacent which the at least one semiconductor light-emitting device, the wavelength converting layer, and the transparent plate are located, and the frame is mounted on the sub mount board so as to surround the at least one semiconductor light-emitting chip;
disposing an uncured reflective material having the filler between the frame and the side surfaces of the at least one semiconductor light-emitting device, the wavelength converting layer and the transparent plate; and
precipitating the filler in the uncured reflective material.

* * * * *